(12) United States Patent
Uehara et al.

(10) Patent No.: US 10,298,206 B2
(45) Date of Patent: May 21, 2019

(54) ACOUSTIC WAVE DEVICE

(71) Applicant: WISOL JAPAN CO., LTD., Kawasaki-shi, Kanagawa (JP)

(72) Inventors: Kensei Uehara, Kawasaki (JP); Takahiro Sato, Kawasaki (JP)

(73) Assignee: WISOL JAPAN CO., LTD., Kawasaki-Shi, Kanagawa (JP)

( * ) Notice: Subject to any disclaimer, the term of this patent is extended or adjusted under 35 U.S.C. 154(b) by 201 days.

(21) Appl. No.: 15/202,737

(22) Filed: Jul. 6, 2016

(65) Prior Publication Data

US 2017/0288631 A1   Oct. 5, 2017

(30) Foreign Application Priority Data

Mar. 29, 2016 (KR) .................. 10-2016-0037771

(51) Int. Cl.
| | |
|---|---|
| H03H 9/64 | (2006.01) |
| H03H 7/01 | (2006.01) |
| H03H 9/02 | (2006.01) |
| H03H 7/075 | (2006.01) |

(52) U.S. Cl.
CPC ........ *H03H 9/6483* (2013.01); *H03H 7/0161* (2013.01); *H03H 7/075* (2013.01); *H03H 9/02637* (2013.01); *H03H 9/64* (2013.01)

(58) Field of Classification Search
CPC ............. H03H 9/02637; H03H 9/6426; H03H 9/6483; H03H 9/64; H03H 7/075; H03H 7/0161

USPC .................. 333/133, 187, 188, 193–196
See application file for complete search history.

(56) References Cited

U.S. PATENT DOCUMENTS

| | | | | |
|---|---|---|---|---|
| 5,294,898 A | * | 3/1994 | Dworsky ................. | H03H 9/25 310/320 |
| 2011/0277286 A1 | * | 11/2011 | Zhang ...................... | H03H 3/04 29/25.35 |
| 2014/0145799 A1 | * | 5/2014 | Jian ....................... | H03H 9/0542 333/189 |

FOREIGN PATENT DOCUMENTS

JP    2002-330054 A    11/2002

* cited by examiner

*Primary Examiner* — Robert J Pascal
*Assistant Examiner* — Jorge L Salazar, Jr.
(74) *Attorney, Agent, or Firm* — LRK Patent Law Firm

(57) ABSTRACT

In order to pass a signal having a wide pass bandwidth with respect to a center frequency of a pass band, a surface acoustic wave device includes a first surface acoustic wave element provided with a first pass band; and a second surface acoustic wave element having a second pass band in a high frequency band compared with the first pass band of the first surface acoustic wave element, in which the first surface acoustic wave element and the second surface acoustic wave element have a common input terminal and a common output terminal, and a frequency of a high frequency side of the first pass band of the first surface acoustic wave element is partially overlapped with a frequency of a low frequency side of the second pass band of the second surface acoustic wave element.

4 Claims, 20 Drawing Sheets

| Band | Name (MP) | Bandwidth (MHz) | Bandwidth (%) |
|---|---|---|---|
| 1 | IMT 2.1 GHz | 60 | 2.8 |
| | IMT 2.1 GHz with B34 | 60 | 2.8 |
| 2 | PCS | 60 | 3.1 |
| 3 | DCS 1800 | 75 | 4.1 |
| 4 | AWS | 45 | 2.1 |
| 5 | 850 MHz | 25 | 2.8 |
| 7 | 2.6 GHz | 70 | 2.6 |
| | 2.6 GHz with WiFi | 70 | 2.6 |
| 8 | 900 MHz | 35 | 3.7 |
| 12 | 700 MHz Lower, A+B+C | 17 | 2.3 |
| 13 | B13 Cosidering Public Safety | 10 | 1.3 |
| 17 | 700 MHz Lower, B+C | 12 | 1.6 |
| 20 | 800 MHz EDD | 30 | 3.7 |
| 25 | PCS 1900 + G Block | 65 | 3.3 |
| 26 | 800 MHz iDEN | 35 | 4.0 |
| 28A | 700 MHz APAC-A | 30 | 3.9 |
| 28B | 700 MHz APAC-B | 30 | 3.8 |
| 28F | 700 MHz APAC | 45 | 5.8 |
| B40 | 2300 ~ 2400 MHz | 100 | 4.3 |
| B41(140MHz) | 2550 ~ 2690 MHz | 140 | 5.3 |
| B41(194MHz) | 2496 ~ 2690 MHz | 194 | 7.5 |

FIG. 20

ACOUSTIC WAVE DEVICE

CROSS-REFERENCE TO RELATED APPLICATION

This application claims priority to Korean Patent Application No. 10-2016-0037771, filed Mar. 29, 2016, the entire content of which is incorporated herein by reference in its entirety.

BACKGROUND OF THE INVENTION

1. Field of the Invention

The present invention relates to an acoustic wave device.

2. Background of the Related Art

A communication device such as a portable terminal or the like mounts an acoustic wave device using a Surface Acoustic Wave (SAW), a Bulk Acoustic Wave (BAW) or the like to extract only a signal of a specific frequency band.

Recently, since radio waves of various frequency bands used for the communication are defined in the specification of 3GPP as shown in FIG. 20, an acoustic wave device corresponding to the frequency bands is required in the communication device such as a portable terminal or the like.

In patent document 1, a surface acoustic wave device configured of a plurality of surface acoustic wave filters is disclosed, in which if the surface acoustic wave filter is used as a branching filter, a pass band may have consistency without being degraded although the fractional bandwidth of the surface acoustic wave filter is wide.

(Patent document 1) Japanese Laid-opened Patent No. 2002-330054

SUMMARY OF THE INVENTION

However, Patent document 1 does not disclose a surface acoustic wave device at all, which can be used for a signal having a wide pass bandwidth in which a ratio of the pass bandwidth (a fractional bandwidth) with respect to the center frequency of a pass band, such as 28F, B41 (140 MHz), B41 (194 MHz) or the like shown in FIG. 20, is likely to exceed 5%.

An object of the present invention is to provide an acoustic wave device such as a surface acoustic wave device, a bulk acoustic wave device or the like, which can pass a signal having a wide pass bandwidth with respect to the center frequency of a pass band.

Another object of the present invention to provide an acoustic wave device having a fractional bandwidth of 5% or more.

To accomplish the above objects, according to one aspect of the present invention, there is provided a surface acoustic wave device comprising: a first acoustic wave element provided with a first pass band; and a second acoustic wave element having a second pass band in a high frequency band compared with the first pass band of the first acoustic wave element, wherein the first acoustic wave element and the second acoustic wave element have a common input terminal and a common output terminal, and a frequency of a high frequency side of the first pass band of the first acoustic wave element is partially overlapped with a frequency of a low frequency side of the second pass band of the second acoustic wave element.

According to another aspect of the present invention, there is provided a surface acoustic wave device comprising: a first acoustic wave element provided with a first pass band; and a second acoustic wave element having a second pass band in a high frequency band compared with the first pass band of the first acoustic wave element, wherein the first acoustic wave element and the second acoustic wave element have a common input terminal and a plurality of output terminals, and a frequency of a high frequency side of the first pass band of the first acoustic wave element is partially overlapped with a frequency of a low frequency side of the second pass band of the second acoustic wave element.

BRIEF DESCRIPTION OF THE DRAWINGS

FIG. 20 is a table showing frequency bands of radio waves used for communication.

DETAILED DESCRIPTION OF THE PREFERRED EMBODIMENT

Hereafter, the modes and embodiments of the present invention will be described in detail with reference to the accompanying drawings.

[First Mode]

Figure 1:
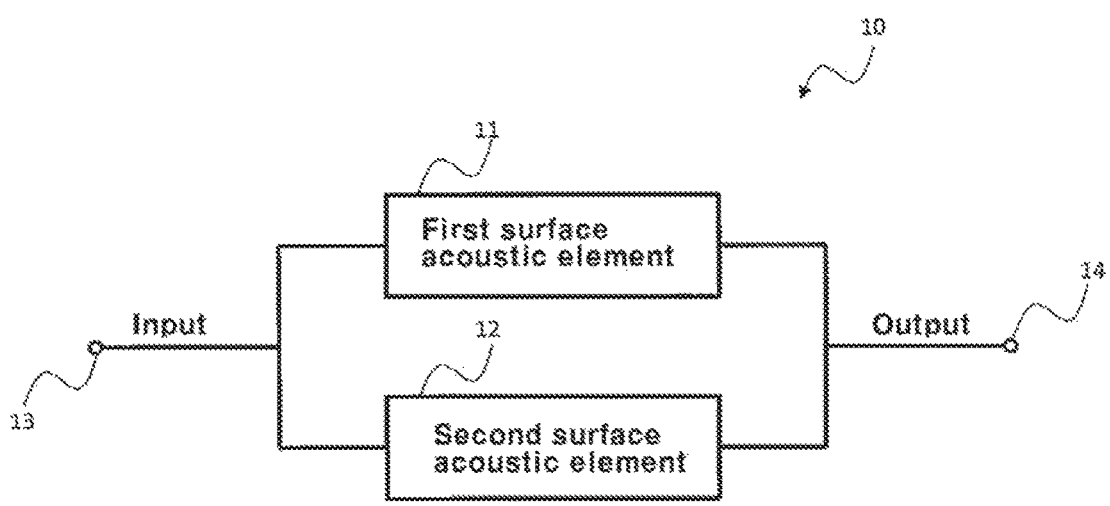
FIG. 1 is a block diagram showing the configuration of a surface acoustic wave device of a first mode of the present invention.

FIG. 1 is a block diagram mimetically showing the configuration of a surface acoustic wave device 10 related to a first mode of the present invention.

The surface acoustic wave device 10 is provided with a first surface acoustic wave element 11, a second surface acoustic wave element 12, an input terminal 13 and an output terminal 14. In the surface acoustic wave device 10, the first surface acoustic wave element 11 and the second surface acoustic wave element 12 are connected in parallel, and the input terminal and the output terminal 14 are common.

The first surface acoustic wave element 11 and the second surface acoustic wave element 12 are general Band Pass Filters (BPFs) passing only a signal of a specific frequency. In addition, the first surface acoustic wave element 11 has a pass band at a low frequency side compared with the second surface acoustic wave element 12.

The surface acoustic wave device 10 having the structure described above cuts off frequencies of frequency bands other than a specific frequency band from a signal input into the input terminal 13 and outputs a signal of the specific frequency band from the output terminal 14. In addition, although the surface acoustic wave device 10 is configured of two BPFs, this is an example, and it may be a structure additionally connecting a plurality of BPFs in parallel.

Figure 2A:
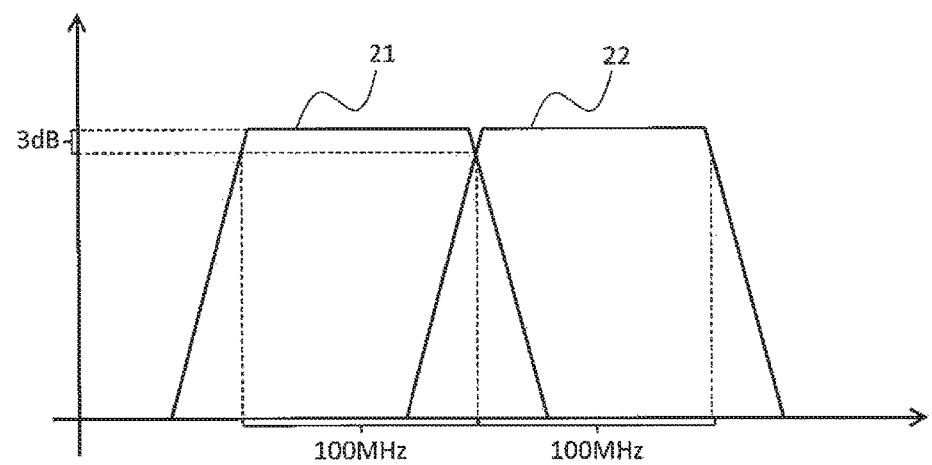
FIGS. 2A and 2B are mimetic views showing the frequency characteristic of a surface acoustic wave device related to a first mode of the present invention.
Figure 2B:
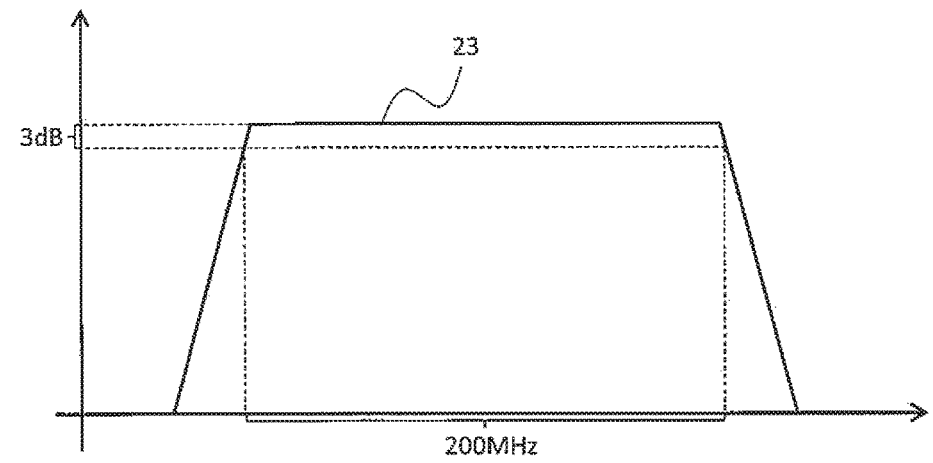

FIGS. 2A and 2B are mimetic views for illustrating the frequency characteristics of the surface acoustic wave element 11 and the second surface acoustic wave element 12.

FIG. 2A is a graph showing the frequency MHz on the horizontal axis and the insertion loss dB on the vertical axis, in which a first frequency characteristic 21 and a second frequency characteristic 22 respectively show the frequency characteristics of the first surface acoustic wave element 11 and the second surface acoustic wave element 12. Referring to FIG. 2A, the first surface acoustic wave element 11 has a pass band at a low frequency side compared with the second surface acoustic wave element 12.

The pass bands of the first frequency characteristic 21 and the second frequency characteristic 22 are practically, for example, 100 MHz and have an attenuation characteristic of steeply decreasing at the low frequency and high frequency sides of the pass bands. In addition, in the pass band on the high frequency side of the first frequency characteristic 21 and the pass band on the low frequency side of the second frequency characteristic 22, the first frequency characteristic 21 and the second frequency characteristic 22 intersect with each other at a section attenuated about 3 dB from the value of the insertion loss of each center frequency.

FIG. 2B is a graph showing the frequency MHz on the horizontal axis and the insertion loss dB on the vertical axis, in which a third frequency characteristic 23 shows the frequency characteristic of the surface acoustic wave device 10.

Referring to FIG. 2A, the pass band of the surface acoustic wave device 10 is practically 200 MHz and has an attenuation characteristic of steeply decreasing at the low frequency and high frequency sides of the pass band. That is, the third frequency characteristic 23 is an aggregation of the first frequency characteristic 21 and the second frequency characteristic 22. That is, the center frequency of the third frequency characteristic 23 is higher than the center frequency of the first frequency characteristic 21 and lower than the center frequency of the second frequency characteristic 22. That is, the surface acoustic wave device 10 may pass a signal having a wide pass bandwidth with respect to the center frequency of the pass band.

In addition, at the input terminal 13 and the output terminal 14, a predetermined relation is established between the reflection coefficients of the first surface acoustic wave element 11 and the second surface acoustic wave element 12. Although this will be described below in detail, if it is assumed that the real part of the reflection coefficient of the first surface acoustic wave element 11 is a1 and the imaginary part is b1, and the real part of the reflection coefficient of the second surface acoustic wave element 12 is a2 and the imaginary part is b2, a relation of a1≥a2 and b1>b2 is established at the input terminal 13 and the output terminal 14.

That is, in order to pass a signal having a wide pass bandwidth with respect to the center frequency of a pass band, the first surface acoustic wave element 11 should have a pass band at a low frequency band compared with the second surface acoustic wave element 12, and at the input terminal 13 and the output terminal 14, a relation of a1≥a2 and b1>b2 needs to be satisfied between the reflection coefficients.

Hereinafter, the present invention will be described based on the embodiments. In addition, like contents will be omitted appropriately to avoid complication of repetition.

[First Embodiment]

Figure 3:
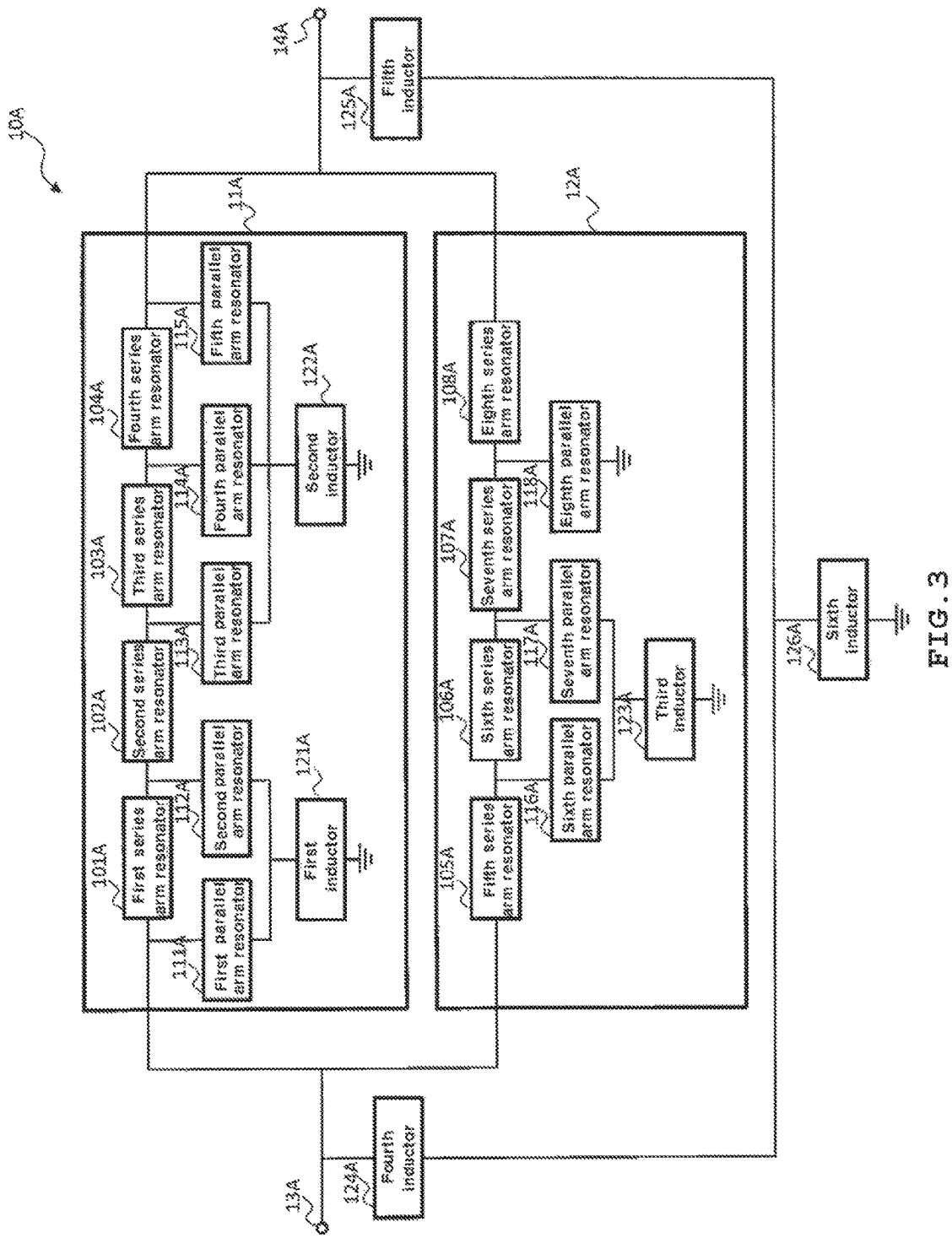
FIG. 3 is a block diagram showing the configuration of a surface acoustic wave device of a first embodiment of the present invention.

FIG. 3 is a block diagram showing a surface acoustic wave device 10A according to a first embodiment of the present invention.

The surface acoustic wave device 10A is provided with a first surface acoustic wave element 11A, a second surface acoustic wave element 12A, an input terminal 13A and an output terminal 14A.

The first surface acoustic wave element 11A is provided with a first series arm resonator 101A, a second series arm resonator 102A, a third series arm resonator 103A, a fourth series arm resonator 104A, a first parallel arm resonator 111A, a second parallel arm resonator 112A, a third parallel arm resonator 113A, a fourth parallel arm resonator 114A, a fifth parallel arm resonator 115A, a first inductor 121A and a second inductor 122A.

The first series arm resonator 101A, the second series arm resonator 102A, the third series arm resonator 103A and the fourth series arm resonator 104A are, for example, general SAW resonators of one port connected to each other in series.

The first parallel arm resonator 111A, the second parallel arm resonator 112A, the third parallel arm resonator 113A, the fourth parallel arm resonator 114A and the fifth parallel arm resonator 115A are, for example, general SAW resonators of one port connected in parallel with respect to the first series arm resonator 101A, the second series arm resonator 102A, the third series arm resonator 103A and the fourth series arm resonator 104A.

In the first surface acoustic wave element 11A, the first parallel arm resonator 111A is connected at a position closest to the input terminal 13A. In addition, the first parallel arm resonator 111A preferably has a resonance frequency lower than the pass band of the first surface acoustic wave element 11A.

The first parallel arm resonator 111A and the second parallel arm resonator 112A are connected in parallel with respect to the first inductor 121A. In addition, the first parallel arm resonator 111A and the second parallel arm resonator 112A are connected to the ground with the intervention of the first inductor 121A.

The third parallel arm resonator 113A, the fourth parallel arm resonator 114A and the fifth parallel arm resonator 115A are connected in parallel with respect to the second inductor 122A. In addition, the third parallel arm resonator 113A, the fourth parallel arm resonator 114A and the fifth parallel arm resonator 115A are connected to the ground with the intervention of the second inductor 122A.

The first inductor 121A and the second inductor 122A are, for example, general inductors.

That is, the first surface acoustic wave element 11A has a structure of connecting a plurality of SAW resonators of one port in the shape of a ladder. The first surface acoustic wave element 11A having such a structure is called as a BPF of a ladder type.

The second surface acoustic wave element 12A is provided with a fifth series arm resonator 105A, a sixth series arm resonator 106A, a seventh series arm resonator 107A, an eighth series arm resonator 108A, a sixth parallel arm resonator 116A, a seventh parallel arm resonator 117A, an eighth parallel arm resonator 118A and a third inductor 123A.

The fifth series arm resonator 105A, the sixth series arm resonator 106A, the seventh series arm resonator 107A and the eighth series arm resonator 108A are, for example, general SAW resonators of one port connected to each other in series.

The sixth parallel arm resonator 116A and the seventh parallel arm resonator 117A are connected to the fifth series arm resonator 105A and the sixth series arm resonator 106A respectively and connected to the third inductor 123A in parallel. On the other hand, the eighth parallel arm resonator 118A is connected between a common connection point of the seventh series arm resonator 107A and the eighth series arm resonator 108A and the ground. The sixth to eighth parallel arm resonators 116A to 118A are general SAW resonators of one port.

The third inductor 123A is, for example, a general inductor.

That is, since the second surface acoustic wave element 12A has a structure of connecting a plurality of SAW resonators of one port in the shape of a ladder like the first surface acoustic wave element 11A, it is a BPF of a ladder type.

A fourth inductor 124A is connected to the input terminal 13A, and a fifth inductor 125A is connected to the output terminal 14A.

The fourth inductor 124A and the fifth inductor 125A are connected to a sixth inductor 126A in parallel. In addition, the other end of the sixth inductor 126A connected to the fourth inductor 124A and the fifth inductor 125A is connected to the ground.

Figure 4:
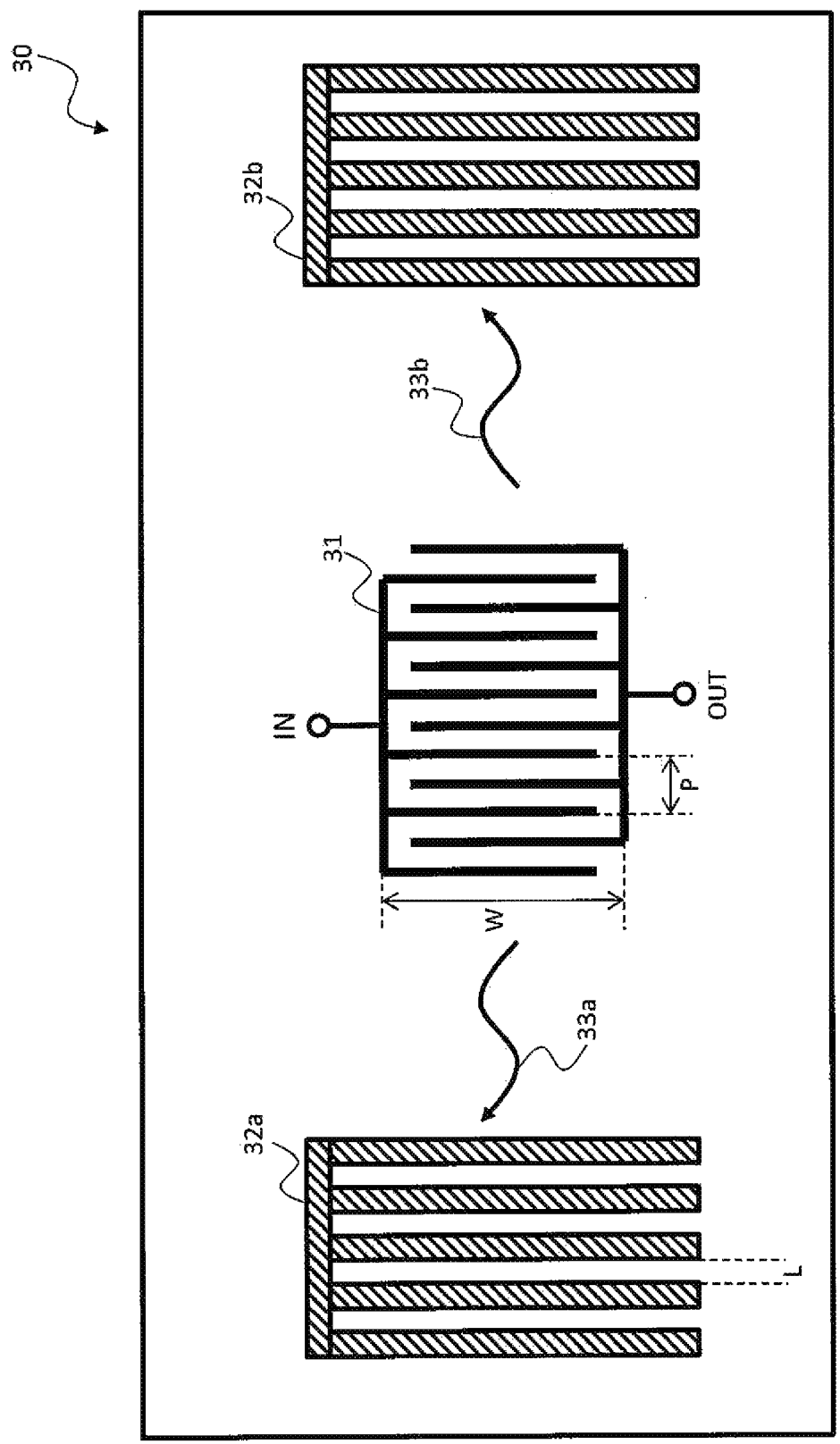
FIG. 4 is a mimetic view showing the configuration of a SAW resonator related to the present invention.

FIG. 4 is a mimetic view showing a SAW resonator configuring each of the resonators shown in FIG. 3.

The SAW resonator 30 is provided with a comb-shaped electrode 31, a first reflector 32a and a second reflector 32b. The SAW resonator 30 is a general SAW resonator of one port having one input terminal and one output terminal.

The comb-shaped electrode 31 is configured of N pairs of electrodes referred to as an Inter Digital Transducer (IDT) formed in the shape of a comb having an opening length of P. The comb-shaped electrode 31 may generate or detect a surface acoustic wave having a frequency corresponding to the opening length P, a width W and the number of pairs N. Specifically, if it is assumed that the frequency of the surface acoustic wave is f, the speed of the surface acoustic wave is v and the opening length is P, the comb-shaped electrode 31 generates or detects a first surface acoustic wave 33a and a second surface acoustic wave 33b satisfying a relation of $f=v/P$.

The first reflector 32a and the second reflector 32b are, for example, reflectors configured by arranging a plurality of electrodes at predetermined intervals L. The comb-shaped electrode 31 is arranged between the first reflector 32a and the second reflector 32b.

Figure 5A:
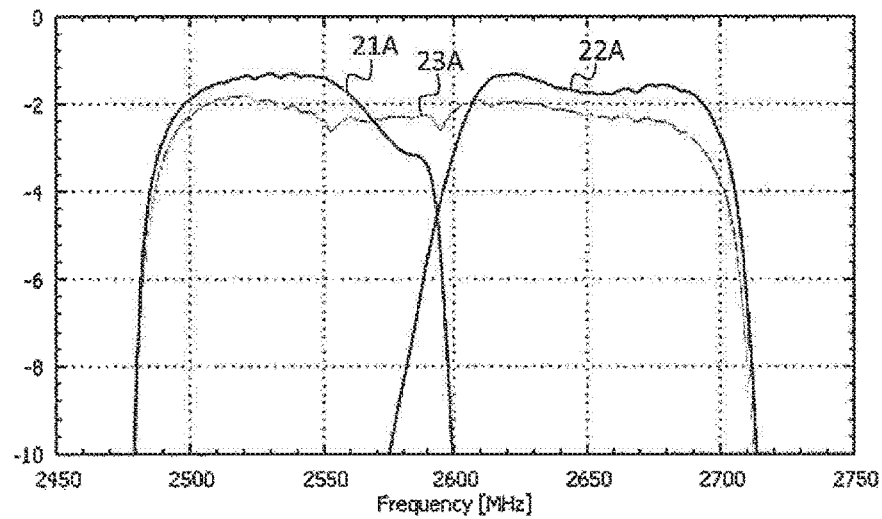
FIGS. 5A and 5B are graphs showing the frequency characteristic of the surface acoustic wave device shown in FIG. 3.
Figure 5B:
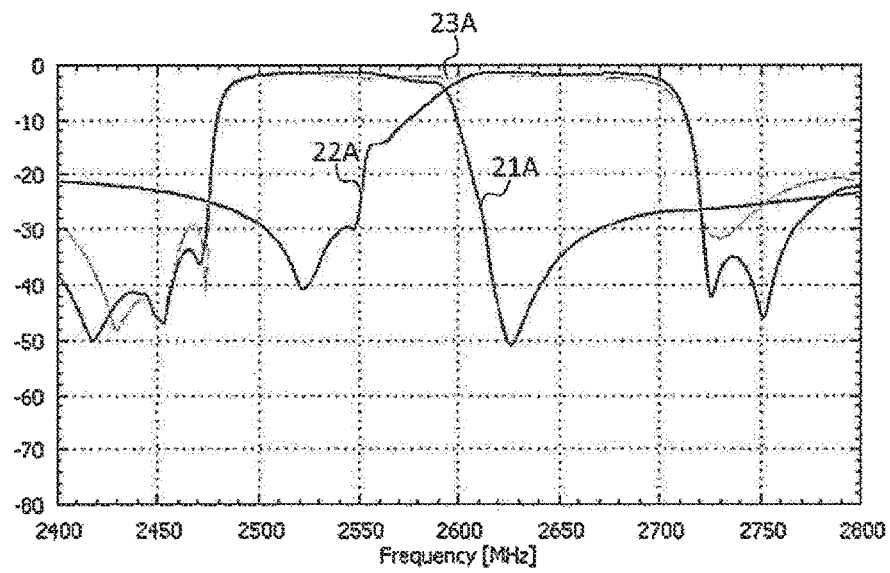

FIGS. 5A and 5B are graphs showing the frequency characteristics of the surface acoustic wave device 10A, the first surface acoustic wave element 11A and the second surface acoustic wave element 12A.

FIG. 5A is a graph showing the frequency MHz on the horizontal axis and the insertion loss dB on the vertical axis, in which a first frequency characteristic 21A, a second frequency characteristic 22A and a third frequency characteristic 23A respectively show the frequency characteristics of the first surface acoustic wave element 11A, the second surface acoustic wave element 12A and the surface acoustic wave device 10A. Specifically, FIG. 5A shows frequency characteristics in range of frequency between 2,450 and 2,750 MHz and insertion loss between −10 and 0 dB.

Referring to FIG. 5A, the first surface acoustic wave element 11A has a pass band at a low frequency side compared with the second surface acoustic wave element 12A.

The pass bands of the first frequency characteristic 21A and the second frequency characteristic 22A are practically 100 MHz and, in addition, have an attenuation characteristic of steeply decreasing at the low frequency and high frequency sides. In addition, on the high frequency side of the first frequency characteristic 21A and the low frequency side of the second frequency characteristic 22A, the first frequency characteristic 21A and the second frequency characteristic 22A intersect with each other at a point where the value of the insertion loss is about −4.3 dB.

The pass band of the third frequency characteristic 23A is practically an aggregation of the pass band of the first frequency characteristic 21A and the pass band of the second frequency characteristic 22A and, in addition, has an attenuation characteristic of steeply decreasing at the low frequency and high frequency sides. That is, the center frequency of the third frequency characteristic 23A is higher than the center frequency of the first frequency characteristic 21A and lower than the center frequency of the second frequency characteristic 22A.

Compared with FIG. 5A, FIG. 5B is a graph showing the frequency characteristics of the surface acoustic wave device 10A, the first surface acoustic wave element 11A and the second surface acoustic wave element 12A seeing the frequency MHz and the insertion loss dB within a further specific range. Specifically, FIG. 5B shows frequency characteristics in range of frequency between 2,400 and 2,800 MHz and insertion loss between −80 and 0 dB.

Referring to FIG. 5B, the third frequency characteristic 23A has a favorable attenuation characteristic even in the attenuation bands of the low frequency and high frequency sides.

That is, the surface acoustic wave device 10A may pass a signal having a wide pass bandwidth with respect to the center frequency of the pass band.

Figure 6B:
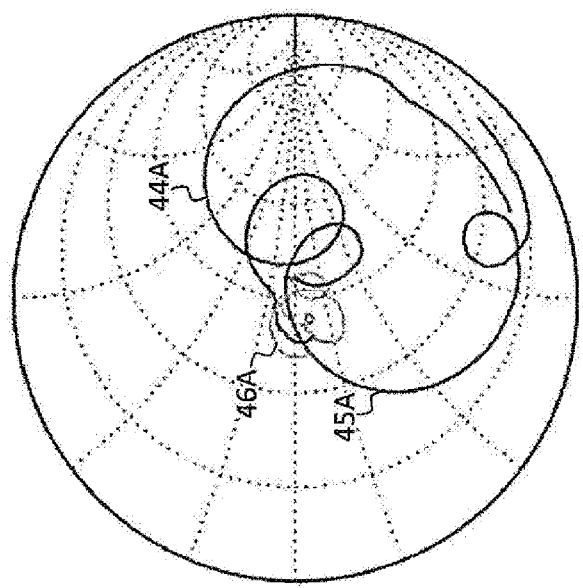
FIGS. 6A and 6B are Smith charts showing the impedance matching of the surface acoustic wave device shown in FIG. 3.
Figure 6A:
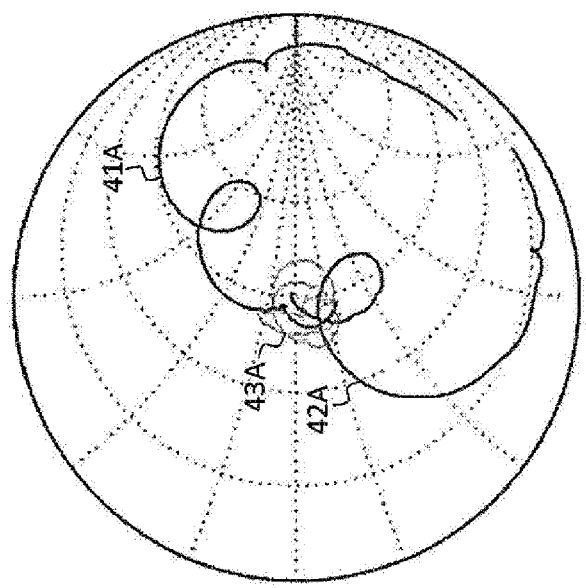

FIGS. 6A and 6B are Smith charts showing the impedance matching of the surface acoustic wave device 10A, the first surface acoustic wave element 11A and the second surface acoustic wave element 12A.

FIG. 6A shows input impedance at the input terminal 13A, and FIG. 6B shows output impedance at the output terminal 14A. In addition, the center of the Smith chart shown in FIG. 6A and FIG. 6B is 50Ω.

In FIG. 6A, a first input impedance 41A, a second input impedance 42A and a third input impedance 43A respectively show input impedance of the first surface acoustic wave element 11A, the second surface acoustic wave element 12A and the surface acoustic wave device 10A. In FIG. 6B, a first output impedance 44A, a second output impedance 45A and a third output impedance 46A respectively show output impedance of the first surface acoustic wave element 11A, the second surface acoustic wave element 12A and the surface acoustic wave device 10A.

Referring to FIG. 6A, the first input impedance 41A and the second input impedance 42A are changed comparatively greatly according to the value of a measurement frequency. However, the third input impedance 43A is comparatively stable since it practically shows 50Ω at each measurement frequency.

Referring to FIG. 6B, the first output impedance 44A and the second output impedance 45A are changed comparatively greatly according to the value of a measurement frequency. However, the third output impedance 46A is comparatively stable since it practically shows 50Ω at each measurement frequency.

That is, the surface acoustic wave device 10A practically has favorable consistency of impedance at 50Ω at each measurement frequency. In addition, consistency of impedance of the surface acoustic wave device 10A can be favorably designed based on reflection coefficients of the input terminal 13A and the output terminal 14A of the first surface acoustic wave element 11A and the second surface acoustic wave element 12A.

Here, specific values of the reflection coefficients of the first surface acoustic wave element 11A and the second surface acoustic wave element 12A are shown in Table 1.

In the same manner, at the output terminal 14A of the surface acoustic wave device 10A, the real part a1 of the reflection coefficient of the first surface acoustic wave element 11A is 0.137, and the imaginary part b1 is 0.141, and the real part a2 of the reflection coefficient of the second surface acoustic wave element 12A is −0.297, and the imaginary part b2 is −0.514. That is, at the output terminal 14A of the surface acoustic wave device 10A, a relation of a1≥a2 and b1>b2 is established between the reflection coefficients of the first surface acoustic wave element 11A and the second surface acoustic wave element 12A.

As described above, in the surface acoustic wave device 10A, the pass band of the first surface acoustic wave element 11A is in a frequency band lower than the pass band of the second surface acoustic wave element 12A, and in addition, the relation of a1≥a2 and b1>b2 is satisfied between the reflection coefficients at the input terminal 13A and the output terminal 14A.

Since the first surface acoustic wave element 11A and the second surface acoustic wave element 12A are designed to satisfy the conditions described above, the surface acoustic wave device 10A has a wide pass bandwidth with respect to the center frequency of the pass band. That is, the surface acoustic wave device 10A having a fractional bandwidth of 5% or more can be configured.

In addition, the first surface acoustic wave element 11A and the second surface acoustic wave element 12A are only examples and do not limit the present invention. The first surface acoustic wave element 11A and the second surface acoustic wave element 12A may be additionally provided with a plurality of SAW resonators and inductors or may be configured of SAW resonators and inductors fewer than the number of SAW resonators shown in the figure. A designer of the surface acoustic wave device 10A may freely change the number, characteristics, arrangement and the like of the SAW resonators and inductors provided in the first surface acoustic wave element 11A and the second surface acoustic wave element 12A.

[Second Embodiment]

Figure 7:
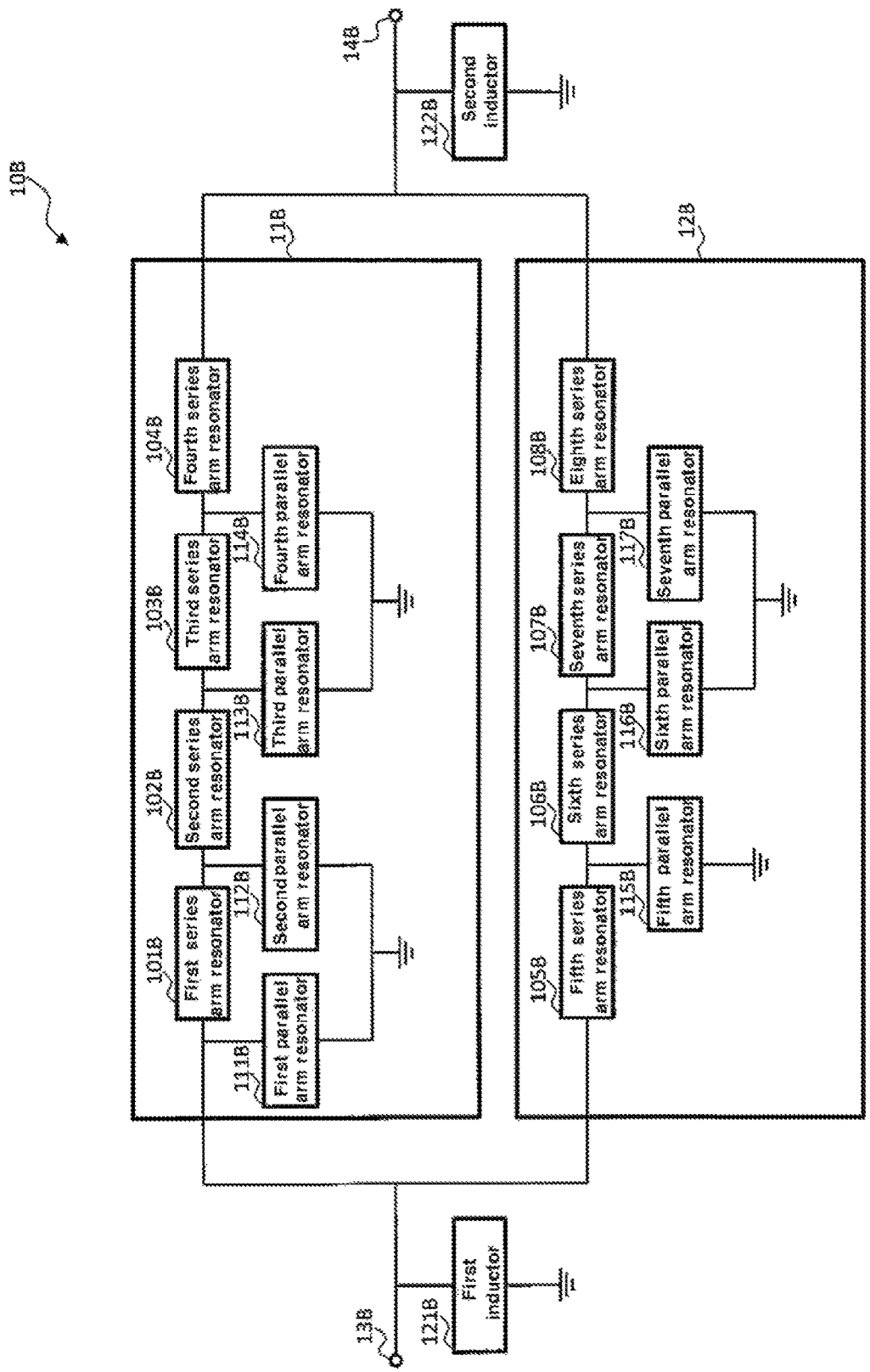
FIG. 7 is a block diagram showing the configuration of a surface acoustic wave device of a second embodiment of the present invention.

FIG. 7 is a block diagram showing the configuration of a surface acoustic wave device 10B of a second embodiment of the present invention.

TABLE 1

| | | First surface acoustic wave (11A) | | Second surface acoustic wave (12A) | | Relation of reflection coefficients | |
|---|---|---|---|---|---|---|---|
| | | Reflection coefficient | Reflection coefficient | Reflection coefficient | Reflection coefficient | | |
| | | (Real part: a1) | (Imaginary part: b1) | (Real part: a2) | (Imaginary part: b2) | Real part | Imaginary part |
| First embodiment | Input terminal | 0.234 | 0.292 | −0.34 | −0.536 | a1 ≥ a2 | b1 > b2 |
| | Output terminal | 0.137 | 0.141 | −0.297 | −0.514 | a1 ≥ a2 | b1 > b2 |

Referring to Table 1, at the input terminal 13A of the surface acoustic wave device 10A, the real part a1 of the reflection coefficient of the first surface acoustic wave element 11A is 0.234, and the imaginary part b1 is 0.292, and the real part a2 of the reflection coefficient of the second surface acoustic wave element 12A is −0.34, and the imaginary part b2 is −0.536. That is, at the input terminal 13A of the surface acoustic wave device 10A, a relation of a1≥a2 and b1>b2 is established between the reflection coefficients of the first surface acoustic wave element 11A and the second surface acoustic wave element 12A.

The surface acoustic wave device 10B is provided with a first surface acoustic wave element 11B, a second surface acoustic wave element 12B, an input terminal 13B and an output terminal 14B.

The first surface acoustic wave element 11B is provided with a first series arm resonator 101B, a second series arm resonator 102B, a third series arm resonator 103B, a fourth series arm resonator 104B, a first parallel arm resonator 111B, a second parallel arm resonator 112B, a third parallel arm resonator 113B and a fourth parallel arm resonator 114B.

The first series arm resonator 101B, the second series arm resonator 102B, the third series arm resonator 103B and the fourth series arm resonator 104B are general SAW resonators of one port connected to each other in series.

The first parallel arm resonator 111B and the second parallel arm resonator 112B are connected between both ends of the first series arm resonator 101B and the ground, and on the other hand, the third parallel arm resonator 113B and the fourth parallel arm resonator 114B are connected between both ends of the third series arm resonator 103B and the ground. The first to fourth parallel arm resonators 111B to 1114B are also general SAW resonators of one port.

As shown in the figure, in the first surface acoustic wave element 11, the first parallel arm resonator 111B is connected at a position closest to the input terminal 13B. In addition, the first parallel arm resonator 111B is preferably set to have a resonance frequency lower than the pass band of the first surface acoustic wave element 11B.

The first parallel arm resonator 111B and the second parallel arm resonator 112B are connected to the common ground, and in the same manner, the third parallel arm resonator 113B and the fourth parallel arm resonator 114B are also connected to the common ground.

That is, since the first surface acoustic wave element 11B has a structure of connecting a plurality of SAW resonators of one port in the shape of a ladder, it is a BPF of a ladder type.

The second surface acoustic wave element 12B is provided with a fifth series arm resonator 105B, a sixth series arm resonator 106B, a seventh series arm resonator 107B, an eighth series arm resonator 108B, an fifth parallel arm resonator 115B, a sixth parallel arm resonator 116B and a seventh parallel arm resonator 117B.

The fifth series arm resonator 105B, the sixth series arm resonator 106B, the seventh series arm resonator 107B and the eighth series arm resonator 108B are, for example, general SAW resonators of one port connected to each other in series.

The fifth parallel arm resonator 115B is connected between fifth series arm resonator 105B and the ground, and the sixth parallel arm resonator 116B and the seventh parallel arm resonator 117B are connected between both ends of seventh series arm resonator 107B and the ground. These parallel arm resonators may be configured of general SAW resonators of one port.

That is, since the second surface acoustic wave element 12B has a structure of connecting a plurality of SAW resonators of one port in the shape of a ladder, it is a BPF of a ladder type.

A first inductor 121B, one end of which is connected to the ground, is connected to the input terminal 13B. A second inductor 122B, one end of which is connected to the ground, is connected to the output terminal 14B.

Figure 8A:
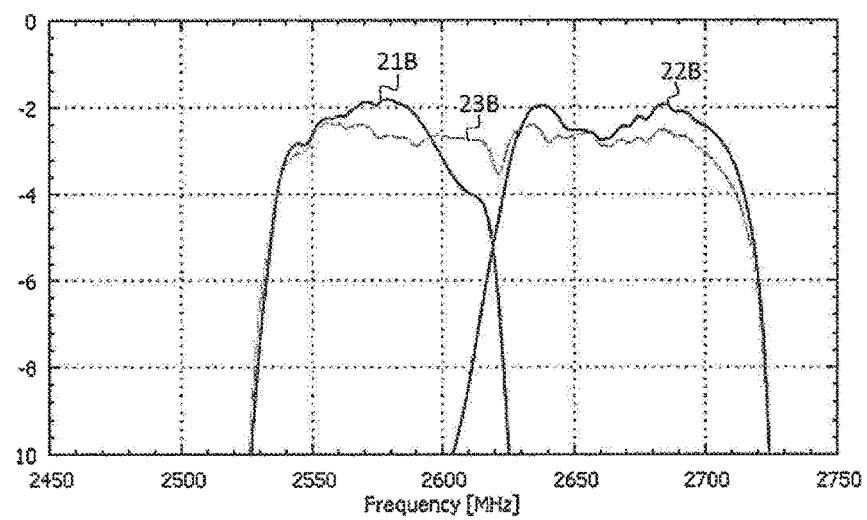
FIGS. 8A and 8b are graphs showing the frequency characteristic of the surface acoustic wave device shown in FIG. 7.
Figure 8B:
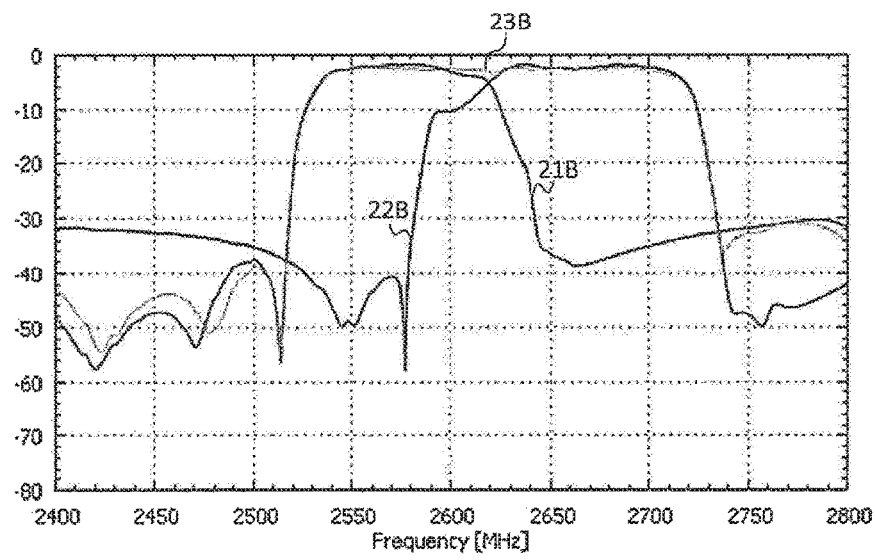

FIGS. 8A and 8B are graphs showing the frequency characteristics of the surface acoustic wave device 10B, the first surface acoustic wave element 11B and the second surface acoustic wave element 12B.

FIG. 8A is a graph showing the frequency MHz on the horizontal axis and the insertion loss dB on the vertical axis, in which a first frequency characteristic 21B, a second frequency characteristic 22B and a third frequency characteristic 23B respectively show the frequency characteristics of the first surface acoustic wave element 11B, the second surface acoustic wave element 12B and the surface acoustic wave device 10B. Specifically, FIG. 8A shows frequency characteristics in a range of frequency between 2,450 and 2,750 MHz and insertion loss between −10 and 0 dB.

The pass bands of the first frequency characteristic 21B and the second frequency characteristic 22B are practically 100 MHz and, in addition, have an attenuation characteristic of steeply decreasing at the low frequency and high frequency sides. In addition, on the high frequency side of the first frequency characteristic 21B and the low frequency side of the second frequency characteristic 22B, the first frequency characteristic 21B and the second frequency characteristic 22B intersect with each other at a point where the value of the insertion loss is about −5.2 dB.

The pass band of the third frequency characteristic 23B is practically an aggregation of the pass band of the first frequency characteristic 21B and the pass band of the second frequency characteristic 22B and, in addition, has an attenuation characteristic of steeply decreasing at the low frequency and high frequency sides. That is, the center frequency of the third frequency characteristic 23B is higher than the center frequency of the first frequency characteristic 21B and lower than the center frequency of the second frequency characteristic 22B.

Compared with FIG. 8A, FIG. 8B shows the frequency characteristics of the surface acoustic wave device 10B, the first surface acoustic wave element 11B and the second surface acoustic wave element 12B seeing the frequency MHz and the insertion loss dB within a further specific range. Specifically, FIG. 8B shows frequency characteristics in a range of frequency between 2,200 and 3,000 MHz and insertion loss between −80 and 0 dB.

Referring to FIG. 8B, the third frequency characteristic 23B has a favorable attenuation characteristic even in the attenuation bands of the low frequency and high frequency sides.

That is, the surface acoustic wave device 10B may pass a signal having a wide pass bandwidth with respect to the center frequency of the pass band.

Figure 9B:
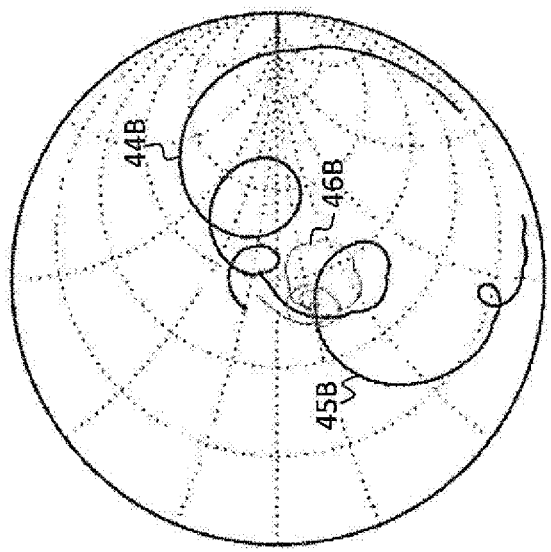
FIGS. 9A and 9B are Smith charts showing the impedance matching of the surface acoustic wave device shown in FIG. 7.
Figure 9A:
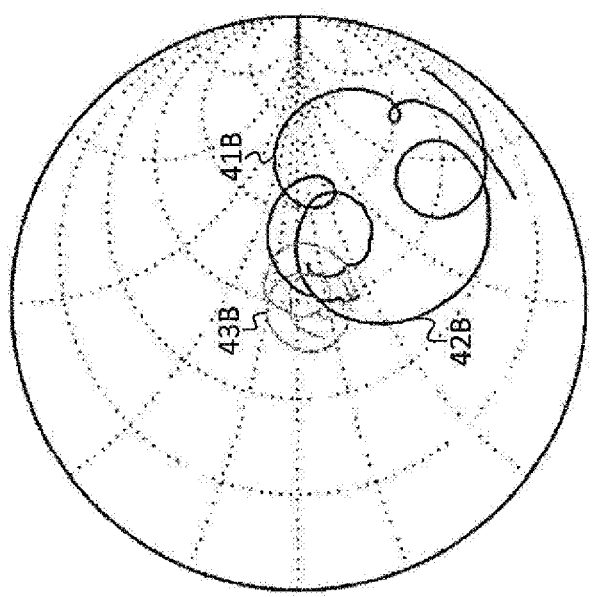

FIGS. 9A and 9B are Smith charts showing the impedance matching of the surface acoustic wave device 10B, the first surface acoustic wave element 11B and the second surface acoustic wave element 12B.

FIG. 9A shows input impedance at the input terminal 13B, and FIG. 9B shows output impedance at the output terminal 14B. In addition, the center of the Smith charts shown in FIG. 9A and FIG. 9B is $50\Omega$.

In FIG. 9A, a first input impedance 41B, a second input impedance 42B and a third input impedance 43B respectively show input impedance of the first surface acoustic wave element 11B, the second surface acoustic wave element 12B and the surface acoustic wave device 10B. In FIG. 9B, a first output impedance 44B, a second output impedance 45B and a third output impedance 46B respectively show output impedance of the first surface acoustic wave element 11B, the second surface acoustic wave element 12B and the surface acoustic wave device 10B.

Referring to FIG. 9A, the first input impedance 41B and the second input impedance 42B are changed comparatively greatly according to change of a measurement frequency. However, the third input impedance 43B is comparatively stable since it practically shows $50\Omega$ at each measurement frequency.

Referring to FIG. 9B, the first output impedance 44B and the second output impedance 45B are changed comparatively greatly according to a measurement frequency. However, the third output impedance 46B is comparatively stable since it practically shows $50\Omega$ at each measurement frequency.

That is, the surface acoustic wave device 10B practically has favorable consistency of impedance at 50Ω at each measurement frequency.

In addition, consistency of impedance of the surface acoustic wave device 10B can be favorably set based on the reflection coefficients of the input terminal 13B and the output terminal 14B of the first surface acoustic wave element 11B and the second surface acoustic wave element 12B.

Here, specific values of the reflection coefficients of the first surface acoustic wave element 11B and the second surface acoustic wave element 12B are shown in Table 2.

TABLE 2

|  |  | First surface acoustic wave (11B) | | Second surface acoustic wave (12B) | | Relation of reflection coefficients | |
|---|---|---|---|---|---|---|---|
|  |  | Reflection coefficient | Reflection coefficient | Reflection coefficient | Reflection coefficient | | |
|  |  | (Real part: a1) | (Imaginary part: b1) | (Real part: a2) | (Imaginary part: b2) | Real part | Imaginary part |
| Second embodiment | Input terminal | 0.378 | 0.039 | 0.061 | −0.58 | a1 ≥ a2 | b1 > b2 |
|  | Output terminal | 0.158 | 0.139 | −0.394 | −0.516 | a1 ≥ a2 | b1 > b2 |

Referring to Table 2, at the input terminal 13B of the surface acoustic wave device 10B, the real part a1 of the reflection coefficient of the first surface acoustic wave element 11B is 0.378, and the imaginary part b1 is 0.039, and the real part a2 of the reflection coefficient of the second surface acoustic wave element 12B is −0.061, and the imaginary part b2 is −0.58. That is, at the input terminal 13B of the surface acoustic wave device 10B, a relation of a1≥a2 and b1>b2 is established.

In the same manner, at the output terminal 14B of the surface acoustic wave device 10B, the real part a1 of the reflection coefficient of the first surface acoustic wave element 11B is 0.158, and the imaginary part b1 is 0.139, and the real part a2 of the reflection coefficient of the second surface acoustic wave element 12B is −0.394, and the imaginary part b2 is −0.516. That is, at the output terminal 14B of the surface acoustic wave device 10B, a relation of a1≥a2 and b1>b2 is established.

As described above, in the surface acoustic wave device 10B, the pass band of the first surface acoustic wave element 11B is in a frequency band lower than the pass band of the second surface acoustic wave element 12B, and in addition, the relation of a1≥a2 and b1>b2 is satisfied between the reflection coefficients at the input terminal 13B and the output terminal 14B.

Since it is designed to satisfy the conditions described above, the surface acoustic wave device 10B having a wide pass bandwidth signal (i.e., a fractional bandwidth of 5% or more) with respect to the center frequency of the pass band is obtained.

In addition, the first surface acoustic wave element 11B and the second surface acoustic wave element 12B are only examples and do not limit the present invention. The first surface acoustic wave element 11B and the second surface acoustic wave element 12B may be additionally provided with a plurality of SAW resonators or may be configured of SAW resonators fewer than the number of SAW resonators shown in the figure. Designers of the surface acoustic wave device 10B may freely change the number, characteristics, arrangement and the like of the SAW resonators provided in the first surface acoustic wave element 11B and the second surface acoustic wave element 12B according to a design.

[Third Embodiment]

Figure 10:
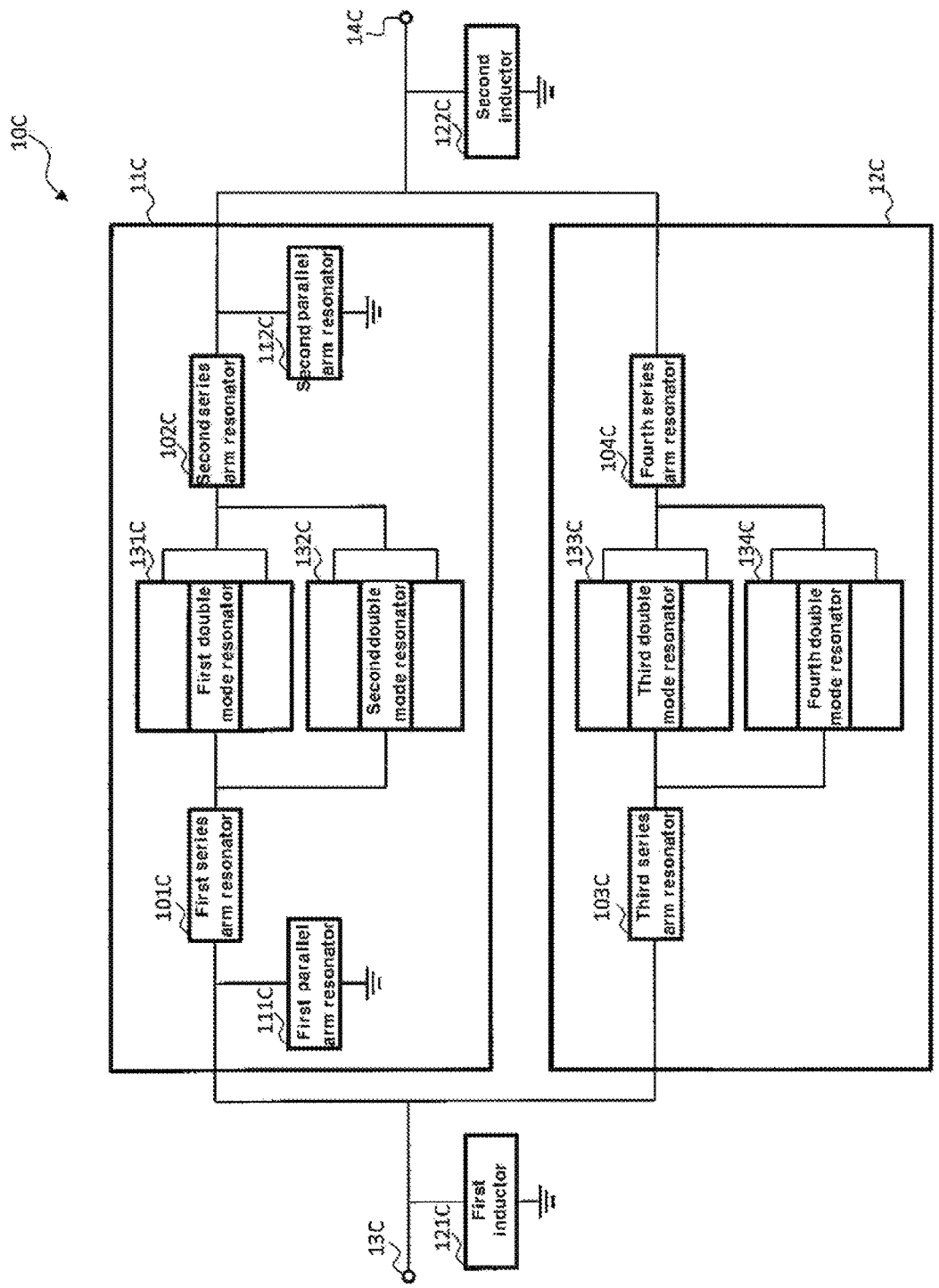
FIG. 10 is a mimetic view showing the configuration of a surface acoustic wave device of a third embodiment of the present invention.

FIG. 10 is a block diagram showing the configuration of a surface acoustic wave device 10C of a third embodiment of the present invention.

The surface acoustic wave device 10C shown in the figure is provided with a first surface acoustic wave element 11C, a second surface acoustic wave element 12C, an input terminal 13C and an output terminal 14C.

The first surface acoustic wave element 11C is provided with a first series arm resonator 101C, a second series arm resonator 102C, a first parallel arm resonator 111C, a second parallel arm resonator 112C, a first double mode resonator 131C and a second double mode resonator 132C.

The first series arm resonator 101C and the second series arm resonator 102C are connected to each other in series and may be configured of general SAW resonators of one port.

The first parallel arm resonator 111C is connected between the input terminal 13C and the ground, and the second parallel arm resonator 112C is connected between the output terminal 14C and the ground. The first parallel arm resonator 111C and the second parallel arm resonator 112C may be configured of, for example, general SAW resonators of one port.

In the first surface acoustic wave element 11C, the first parallel arm resonator 111C is connected at a position closest to the input terminal 13C. In addition, the first parallel arm resonator 111C is preferably set to have a resonance frequency lower than the pass band of the first surface acoustic wave element 11C.

The first double mode resonator 131C and the second double mode resonator 132C are SAW resonators respectively having three IDTs between reflectors. In addition, the first double mode resonator 131C and the second double mode resonator 132C are connected to each other in parallel. In addition, the first double mode resonator 131C and the second double mode resonator 132C are connected between the first series arm resonator 101C and the second series arm resonator 102C.

A BPF provided with a SAW resonator having at least two IDTS between reflectors like the first surface acoustic wave element 11C is referred to as a BPF of a Double Mode SAW (DMS) type.

The second surface acoustic wave element 12C is provided with a third series arm resonator 103C, a fourth series arm resonator 104C, a third double mode resonator 133C and a fourth double mode resonator 134C. The second surface acoustic wave element 12C is different from the first surface acoustic wave element 11C in that it is not provided with a parallel arm resonator.

The third series arm resonator 103C and the fourth series arm resonator 104C are, for example, SAW resonators of one port.

The third double mode resonator 133C and the fourth double mode resonator 134C are SAW resonators respectively having three IDTs between reflectors. In addition, the third double mode resonator 133C and the fourth double mode resonator 134C are connected to each other in parallel and connected between the third series arm resonator 103C and the fourth series arm resonator 104C.

That is, the second surface acoustic wave element 12C is a DMS type provided with a SAW resonator having at least two IDTs.

A first inductor 121C is connected between the input terminal 13C and the ground, and a second inductor 122C is additionally connected between the output terminal 14C and the ground.

Figure 11A:
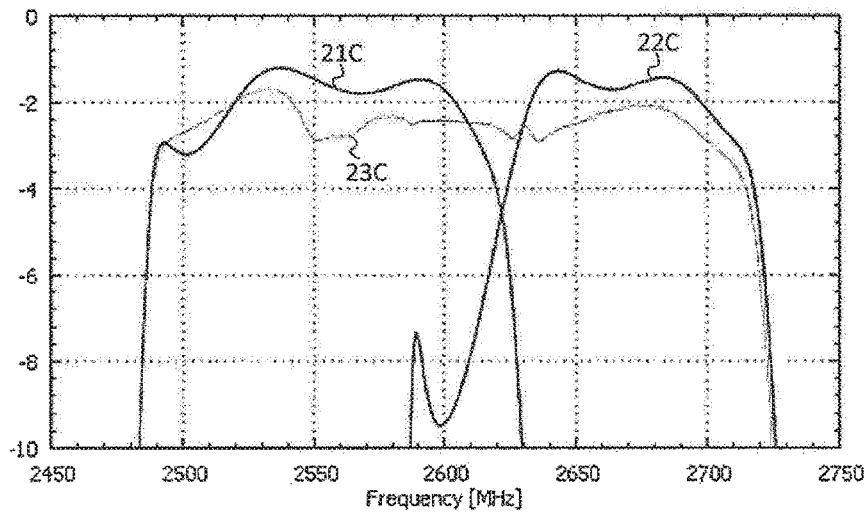
FIGS. 11A and 11B are graphs showing the frequency characteristic of the surface acoustic wave device shown in FIG. 10.
Figure 11B:
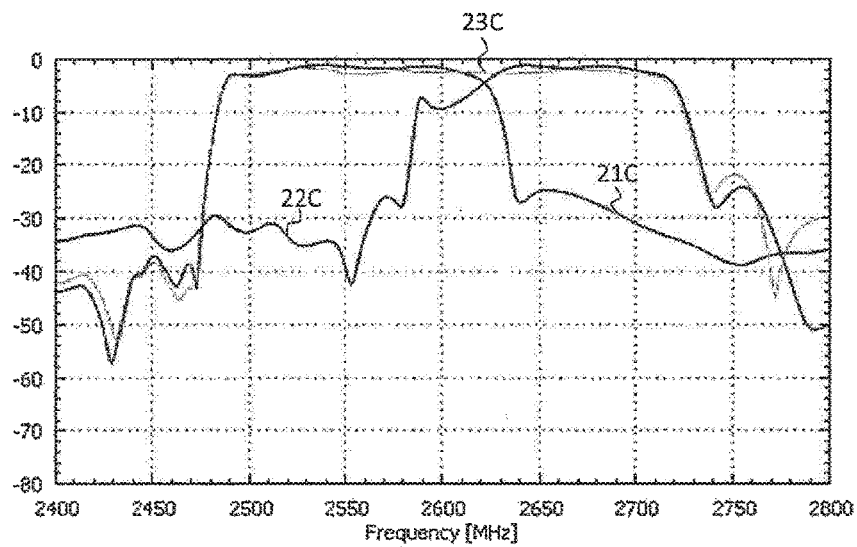

FIGS. 11A and 11B are graphs showing the frequency characteristics of the surface acoustic wave device 10C, the first surface acoustic wave element 11C and the second surface acoustic wave element 12C.

FIG. 11A is a graph showing the frequency MHz on the horizontal axis and the insertion loss dB on the vertical axis, in which a first frequency characteristic 21C, a second frequency characteristic 22C and a third frequency characteristic 23C respectively show the frequency characteristics of the first surface acoustic wave element 11C, the second surface acoustic wave element 12C and the surface acoustic wave device 10C. Specifically, FIG. 11A shows frequency characteristics in a range of frequency between 2,450 and 2,750 MHz and insertion loss between −10 and 0 dB.

The pass bands of the first frequency characteristic 21C and the second frequency characteristic 22C are practically 100 MHz and, in addition, have an attenuation characteristic of steeply decreasing at the low frequency and high frequency sides. In addition, on the high frequency side of the first frequency characteristic 21C and the low frequency side of the second frequency characteristic 22C, the first frequency characteristic 21C and the second frequency characteristic 22C intersect with each other at a point where the value of the insertion loss is about −4.6 dB.

The pass band of the third frequency characteristic 23C is practically an aggregation of the pass band of the first frequency characteristic 21C and the pass band of the second frequency characteristic 22C and, in addition, has an attenuation characteristic of steeply decreasing at the low frequency and high frequency sides. That is, the center frequency of the third frequency characteristic 23C is higher than the center frequency of the first frequency characteristic 21C and lower than the center frequency of the second frequency characteristic 22C.

Compared with FIG. 11A, FIG. 11B shows the frequency characteristics of the surface acoustic wave device 10C, the first surface acoustic wave element 11C and the second surface acoustic wave element 12C seeing the frequency MHz and the insertion loss dB within a further specific range. Specifically, FIG. 11B shows frequency characteristics in a range of frequency between 2,300 and 2,900 MHz and insertion loss between −80 and 0 dB.

Referring to FIG. 11B, the third frequency characteristic 23C has a favorable attenuation characteristic even in the attenuation bands of the low frequency and high frequency sides.

That is, the surface acoustic wave device 10C may pass a signal having a wide pass bandwidth with respect to the center frequency of the pass band.

Figure 12B:
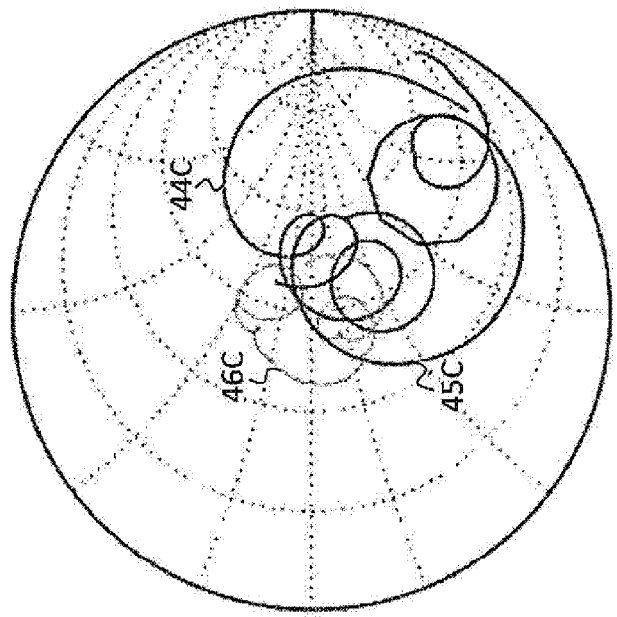
FIGS. 12A and 12B are Smith charts showing the impedance matching of the surface acoustic wave device shown in FIG. 10.
Figure 12A:
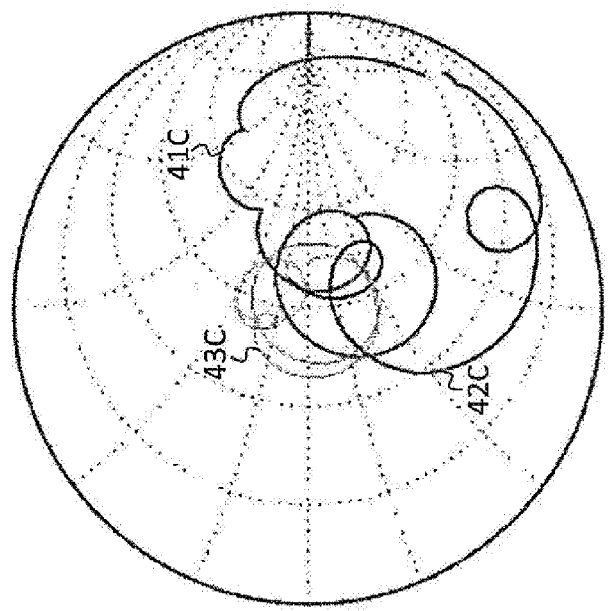

FIGS. 12A and 12B are Smith charts showing the impedance matching of the surface acoustic wave device 10C, the first surface acoustic wave element 11C and the second surface acoustic wave element 12C.

FIG. 12A shows input impedance at the input terminal 13C, and FIG. 12B shows output impedance at the output terminal 14C. In addition, the center of the Smith charts shown in FIG. 12A and FIG. 12B is 50Ω.

In FIG. 12A, a first input impedance 41C, a second input impedance 42C and a third input impedance 43C respectively show input impedance of the first surface acoustic wave element 11C, the second surface acoustic wave element 12C and the surface acoustic wave device 10C. In FIG. 12B, a first output impedance 44C, a second output impedance 45C and a third output impedance 46C respectively show output impedance of the first surface acoustic wave element 11C, the second surface acoustic wave element 12C and the surface acoustic wave device 10C.

Referring to FIG. 12A, the first input impedance 41C and the second input impedance 42C are changed comparatively greatly according to change of a measurement frequency. However, the third input impedance 43C is comparatively stable since it practically shows 50Ω at each measurement frequency.

Referring to FIG. 12B, the first output impedance 44C and the second output impedance 45C are changed comparatively greatly according to change of a measurement frequency. However, the third output impedance 46C is comparatively stable since it practically shows 50Ω at each measurement frequency.

That is, the surface acoustic wave device 10C practically has favorable consistency of impedance at 50Ω at each measurement frequency.

In addition, consistency of impedance of the surface acoustic wave device 10C can be favorably set based on the reflection coefficients of the input terminal 13C and the output terminal 14C of the first surface acoustic wave element 11C and the second surface acoustic wave element 12C.

Here, specific values of the reflection coefficients of the first surface acoustic wave element 11C and the second surface acoustic wave element 12C are shown in Table 3.

TABLE 3

| | | First surface acoustic wave (11C) | | Second surface acoustic wave (12C) | | Relation of reflection coefficients | |
|---|---|---|---|---|---|---|---|
| | | Reflection coefficient | Reflection coefficient | Reflection coefficient | Reflection coefficient | | |
| | | (Real part: a1) | (Imaginary part: b1) | (Real part: a2) | (Imaginary part: b2) | Real part | Imaginary part |
| Third embodiment | Input terminal | 0.337 | 0.196 | −0.131 | −0.62 | a1 ≥ a2 | b1 > b2 |
| | Output terminal | 0.206 | −0.01 | −0.002 | −0.627 | a1 ≥ a2 | b1 > b2 |

Referring to Table 3, at the input terminal 13C of the surface acoustic wave device 10C, the real part a1 of the reflection coefficient of the first surface acoustic wave element 11C is 0.337, and the imaginary part b1 is 0.196, and the real part a2 of the reflection coefficient of the second surface acoustic wave element 12C is −0.131, and the imaginary part b2 is −0.62. That is, at the input terminal 13C of the surface acoustic wave device 10C, a relation of a1≥a2 and b1>b2 is established.

In the same manner, at the output terminal 14C of the surface acoustic wave device 10C, the real part a1 of the reflection coefficient of the first surface acoustic wave element 11C is 0.206, and the imaginary part b1 is −0.01, and the real part a2 of the reflection coefficient of the second surface acoustic wave element 12C is −0.002, and the imaginary part b2 is −0.627. That is, at the output terminal 14C of the surface acoustic wave device 10C, a relation of a1≥a2 and b1>b2 is established.

As described above, in the surface acoustic wave device 10C, the pass band of the first surface acoustic wave element 11C is in a frequency band lower than the pass band of the second surface acoustic wave element 12C, and in addition, the relation of a1≥a2 and b1>b2 is satisfied between the reflection coefficients at the input terminal 13C and the output terminal 14C.

Since it is designed to satisfy the conditions described above, the surface acoustic wave device 10C having a wide pass bandwidth signal (i.e., a fractional bandwidth of 5% or more) with respect to the center frequency of the pass band is obtained.

In addition, the first surface acoustic wave element 11C and the second surface acoustic wave element 12C are only examples and do not limit the present invention. The first surface acoustic wave element 11C and the second surface acoustic wave element 12C may be additionally provided with a plurality of SAW resonators, IDTs and the like or may be configured of SAW resonators, IDTs and the like fewer than the number of SAW resonators, IDTs and the like shown in the figure. Designers of the surface acoustic wave device 10C may freely change the number, characteristics, arrangement and the like of the SAW resonators, IDTs and the like provided in the first surface acoustic wave element 11C and the second surface acoustic wave element 12C.

[Fourth Embodiment]

Figure 13:
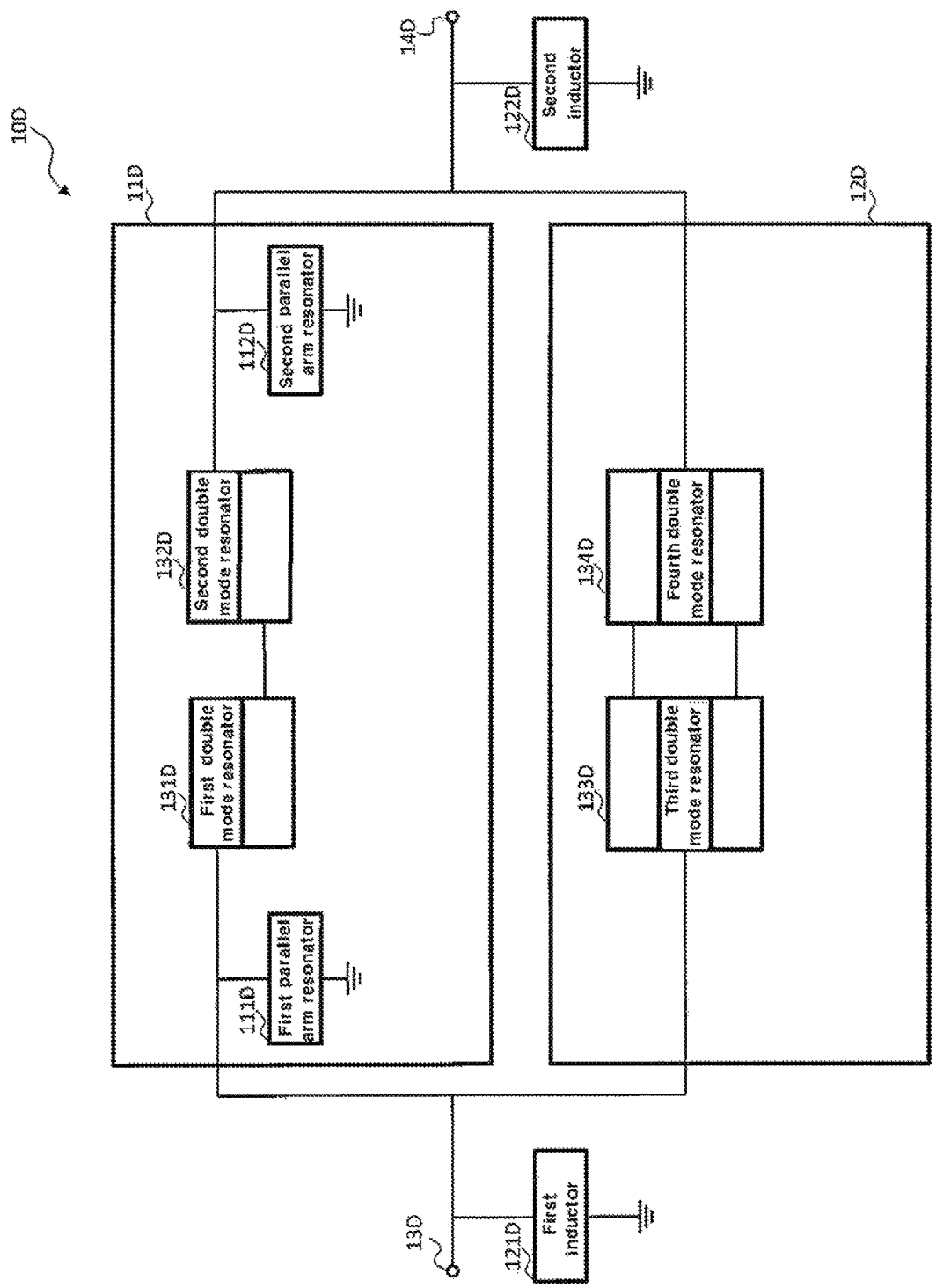
FIG. 13 is a mimetic view showing the configuration of a surface acoustic wave device of a fourth embodiment of the present invention.

FIG. 13 is a block diagram showing the configuration of a surface acoustic wave device 10D of a fourth embodiment of the present invention.

The surface acoustic wave device 10D shown in the figure is provided with a first surface acoustic wave element 11D, a second surface acoustic wave element 12D, an input terminal 13D and an output terminal 14D.

The first surface acoustic wave element 11D is provided with a first parallel arm resonator 111D, a second parallel arm resonator 112D, a first double mode resonator 131D and a second double mode resonator 132D.

The first double mode resonator 131O and the second double mode resonator 132D connected to each other in series are connected between the first parallel arm resonator 111D and the second parallel arm resonator 112D. Here, the first parallel arm resonator 111D and the second parallel arm resonator 112D are general SAW resonators.

In the first surface acoustic wave element 11D, the first parallel arm resonator 111D is connected at a position closest to the input terminal 13D. In addition, the first parallel arm resonator 111D is preferably set to have a resonance frequency lower than the pass band of the first surface acoustic wave element 11D.

The first double mode resonator 131D and the second double mode resonator 132D may be configured of, for example, SAW resonators having two IDTs between reflectors.

That is, since the first surface acoustic wave element 11D shown in the figure is provided with a SAW resonator having at least two IDTs, it is a DMS type.

The second surface acoustic wave element 12D is provided with a third double mode resonator 133D and a fourth double mode resonator 134D and is different from the first surface acoustic wave element 11D in that it is not provided with a parallel arm resonator.

The third double mode resonator 133D and the fourth double mode resonator 134D are SAW resonators respectively having three IDTs between reflectors, and the third double mode resonator 133D and the fourth double mode resonator 134D are connected to each other in series.

That is, since the second surface acoustic wave element 12D is provided with a SAW resonator having at least two IDTs, it is a DMS type.

A first inductor 121D is connected between the input terminal 13D and the ground, and a second inductor 122D is connected between the output terminal 140 and the ground.

Figure 14A:
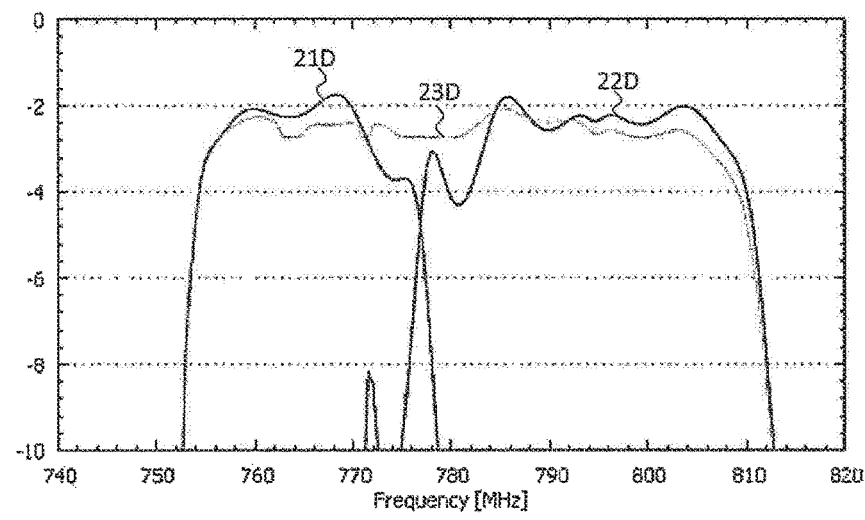
FIGS. 14A and 14B are graphs showing the frequency characteristic of the surface acoustic wave device shown in FIG. 13.
Figure 14B:
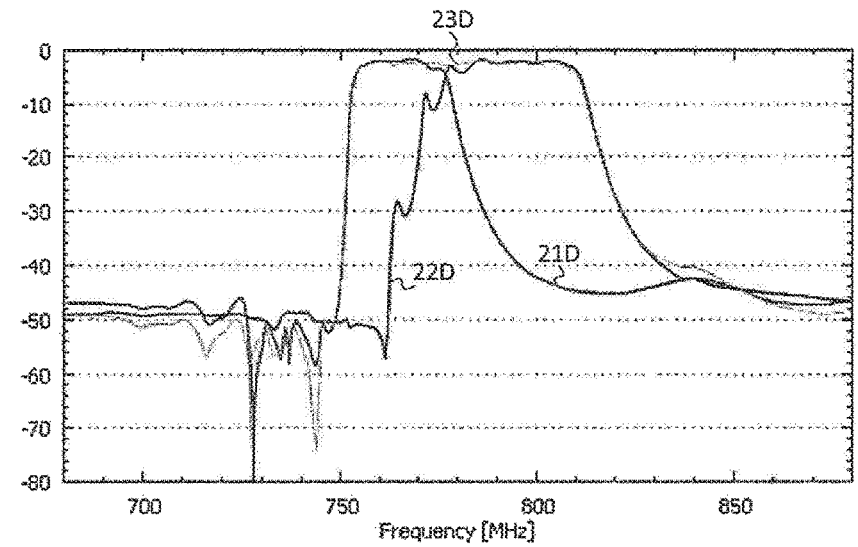

FIGS. 14A and 14B are graphs showing the frequency characteristics of the surface acoustic wave device 10D, the first surface acoustic wave element 110 and the second surface acoustic wave element 12D.

FIG. 14A is a graph showing the frequency MHz on the horizontal axis and the insertion loss dB on the vertical axis, in which a first frequency characteristic 21D, a second frequency characteristic 22D and a third frequency characteristic 23D respectively show the frequency characteristics of the first surface acoustic wave element 11D, the second surface acoustic wave element 12D and the surface acoustic wave device 10D. Specifically, FIG. 14A shows frequency characteristics in a range of frequency between 740 and 820 MHz and insertion loss between −10 and 0 dB.

The pass bands of the first frequency characteristic 21D and the second frequency characteristic 22D are practically 100 MHz and, in addition, have an attenuation characteristic of steeply decreasing at the low frequency and high frequency sides. In addition, on the high frequency side of the first frequency characteristic 21D and the low frequency side of the second frequency characteristic 22D, the first frequency characteristic 21D and the second frequency characteristic 22D intersect with each other at a point where the value of the insertion loss is about −6.6 dB.

The pass band of the third frequency characteristic 23D is practically an aggregation of the pass band of the first frequency characteristic 21D and the pass band of the second frequency characteristic 22D and, in addition, has an attenuation characteristic of steeply decreasing at the low frequency and high frequency sides. That is, the center frequency of the third frequency characteristic 23D is higher than the center frequency of the first frequency characteristic 21D and lower than the center frequency of the second frequency characteristic 22D.

Compared with FIG. 14A, FIG. 14B shows the frequency characteristics of the surface acoustic wave device 10D, the first surface acoustic wave element 11D and the second surface acoustic wave element 12D seeing the frequency MHz and the insertion loss dB within a further specific range. Specifically, FIG. 14B shows frequency characteristics in a range of frequency between 680 and 820 MHz and insertion loss between −80 and 0 dB.

Referring to FIG. 14B, the third frequency characteristic 23D has a favorable attenuation characteristic even in the attenuation bands of the low frequency and high frequency sides.

That is, the surface acoustic wave device 10D may pass a signal having a wide pass bandwidth with respect to the center frequency of the pass band.

Figure 15B:
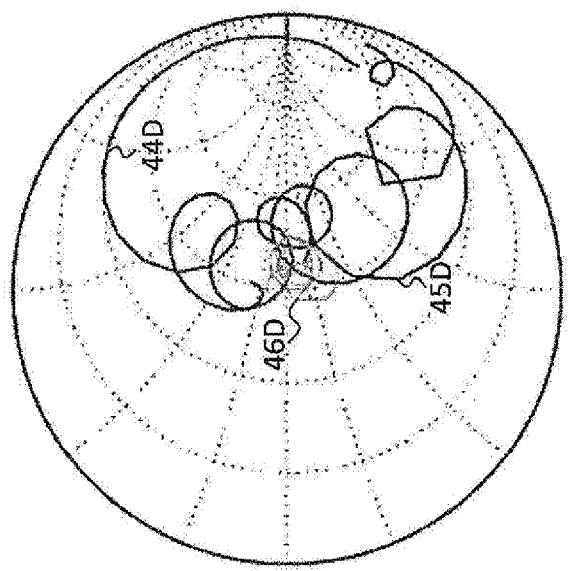
FIGS. 15A and 15B are Smith charts showing the impedance matching of the surface acoustic wave device shown in FIG. 13.
Figure 15A:
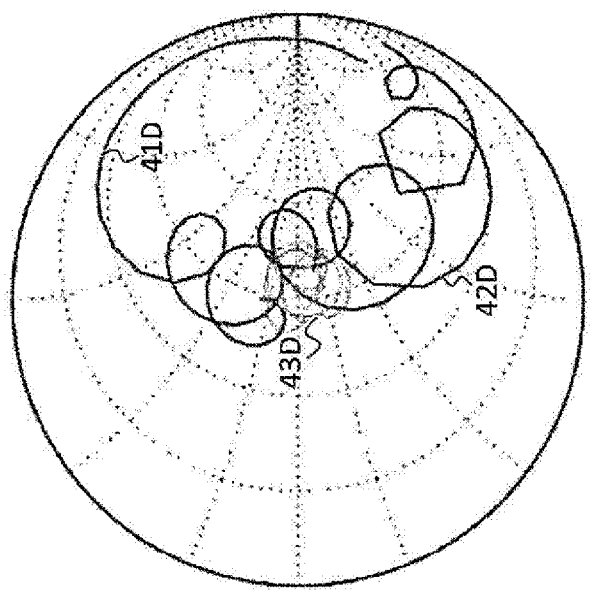

FIGS. 15A and 15B are Smith charts showing the impedance matching of the surface acoustic wave device 100, the first surface acoustic wave element 11D and the second surface acoustic wave element 12D.

FIG. 15A shows input impedance at the input terminal 130, and FIG. 15B shows output impedance at the output terminal 14D. In addition, the center of the Smith charts shown in FIG. 15A and FIG. 15B is 50Ω.

In FIG. 15A, a first input impedance 41D, a second input impedance 42D and a third input impedance 43D respectively show input impedance of the first surface acoustic wave element 11D, the second surface acoustic wave element 12D and the surface acoustic wave device 10D. In FIG. 15(b), a first output impedance 44D, a second output impedance 45D and a third output impedance 46D respectively show output impedance of the first surface acoustic wave element 11D, the second surface acoustic wave element 12D and the surface acoustic wave device 10D.

Referring to FIG. 15A, the first input impedance 41D and the second input impedance 42D are changed comparatively greatly according to change of a measurement frequency. However, the third input impedance 43D is comparatively stable since it practically shows 50Ω at each measurement frequency.

Referring to FIG. 15B, the first output impedance 44D and the second output impedance 45D are changed comparatively greatly according to change of a measurement frequency. However, the third output impedance 46D is comparatively stable since it practically shows 50Ω at each measurement frequency.

That is, the surface acoustic wave device 10D practically has favorable consistency of impedance at 50Ω at each measurement frequency.

In addition, consistency of impedance of the surface acoustic wave device 10D can be favorably set based on the reflection coefficients of the input terminal 13D and the output terminal 14D of the first surface acoustic wave element 11D and the second surface acoustic wave element 12D.

Here, specific values of the reflection coefficients of the first surface acoustic wave element 11D and the second surface acoustic wave element 12D are shown in Table 4.

Referring to Table 4, at the input terminal 13D of the surface acoustic wave device 10D, the real part a1 of the reflection coefficient of the first surface acoustic wave element 11D is −0.014, and the imaginary part b1 is 0.485, and the real part a2 of the reflection coefficient of the second surface acoustic wave element 12D is −0.171, and the imaginary part b2 is −0.407. That is, at the input terminal 13D of the surface acoustic wave device 10D, a relation of a1≥a2 and b1>b2 is established.

In the same manner, at the output terminal 14D of the surface acoustic wave device 10D, the real part a1 of the reflection coefficient of the first surface acoustic wave element 11D is −0.006, and the imaginary part b1 is 0.45, and the real part a2 of the reflection coefficient of the second surface acoustic wave element 12D is −0.162, and the imaginary part b2 is −0.377. That is, at the output terminal 14D of the surface acoustic wave device 10D, a relation of a1≥a2 and b1>b2 is established.

As described above, in the surface acoustic wave device 10D, the pass band of the first surface acoustic wave element 11D is in a frequency band lower than the pass band of the second surface acoustic wave element 12D, and in addition, the relation of a1≥a2 and b1>b2 is satisfied between the reflection coefficients at the input terminal 13D and the output terminal 14D.

Since it is designed to satisfy the conditions described above, the surface acoustic wave device 10D having a wide pass bandwidth signal (i.e., a fractional bandwidth of 5% or more) with respect to the center frequency of the pass band is obtained.

In addition, the first surface acoustic wave element 11D and the second surface acoustic wave element 12D are only examples and do not limit the present invention. The first surface acoustic wave element 11D and the second surface acoustic wave element 12D may be additionally provided with a plurality of SAW resonators, IDTs and the like or may be configured of SAW resonators, IDTs and the like fewer than the number of SAW resonators, IDTs and the like shown in the figure. Designers of the surface acoustic wave device 10D may freely change the number, characteristics, arrangement and the like of the SAW resonators, IDTs and the like provided in the first surface acoustic wave element 11D and the second surface acoustic wave element 12D.

In the first embodiment, second embodiment, third embodiment and fourth embodiment described above in detail, although both the two BPFs are BPFs of a ladder type or a DMS type, these are examples, and it may be that one is a ladder type, and the other is a DMS type. In addition, there are no special restrictions on the two BPFs used in the present invention, and if conditions such as the pass band, consistency of impedance and the like are satisfied, the BPFs can be freely combined according to a design.

TABLE 4

| | | First surface acoustic wave (11D) | | Second surface acoustic wave (12D) | | Relation of reflection coefficients | |
|---|---|---|---|---|---|---|---|
| | | Reflection coefficient | Reflection coefficient | Reflection coefficient | Reflection coefficient | | |
| | | (Real part: a1) | (Imaginary part: b1) | (Real part: a2) | (Imaginary part: b2) | Real part | Imaginary part |
| Fourth embodiment | Input terminal | −0.014 | 0.485 | −0.171 | −0.407 | a1 ≥ a2 | b1 > b2 |
| | Output terminal | −0.006 | 0.45 | −0.162 | −0.337 | a1 ≥ a2 | b1 > b2 |

[Second Mode]

Figure 16:
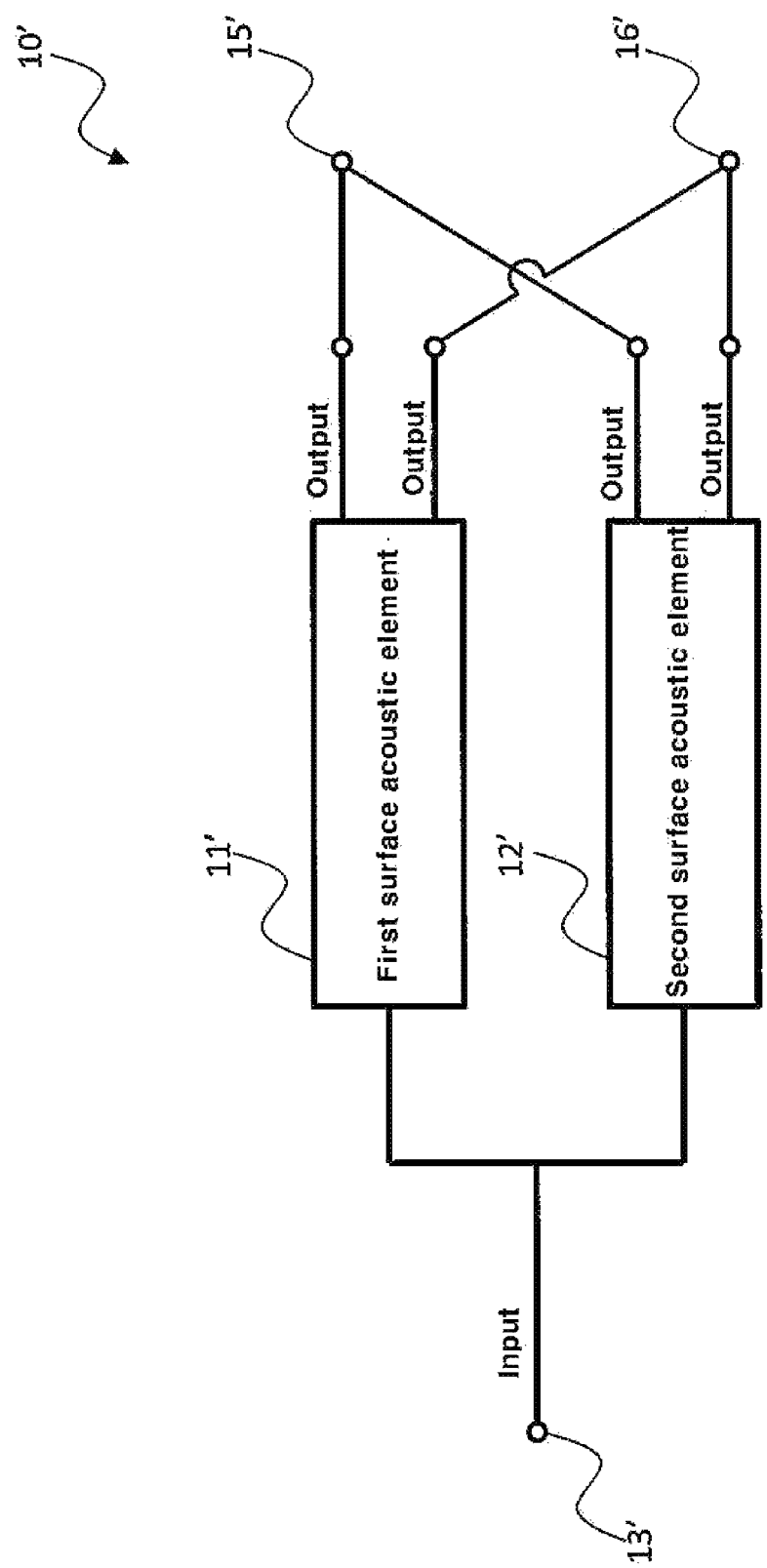
FIG. 16 is a block diagram showing the configuration of a surface acoustic wave device of a second mode of the present invention.

FIG. 16 is a block diagram mimetically showing a surface acoustic wave device 10' related to a second mode of the present invention.

The surface acoustic wave device 10' is provided with a first surface acoustic wave element 11', a second surface acoustic wave element 12', an input terminal 13', a first output terminal 15' and a second output terminal 16'.

The first surface acoustic wave element 11' and the second surface acoustic wave element 12' respectively have two balanced output terminals.

The first output terminal 15' may be formed by wiring one of output terminals of the first surface acoustic wave element 11' and one of output terminals of the second surface acoustic wave element 12'.

The second output terminal 16' may be formed by wiring the other output terminal of the first surface acoustic wave element 11' and the other output terminal of the second surface acoustic wave element 12'.

Therefore, the surface acoustic wave device 10' passes a signal input into the input terminal 13' by cutting off frequencies of frequency bands other than a specific frequency band and outputs the signal from the first output terminal 15' and the second output terminal 16'.

That is, unlike the surface acoustic wave device 10, the surface acoustic wave device 10' is provided with two balanced output terminals. That is, the present invention is not limited to the surface acoustic wave devices of an unbalanced type shown in the first to fourth embodiments and may be applied to a surface acoustic wave device of a balanced type.

Hereinafter, the present invention will be described based on an embodiment.

[Fifth Embodiment]

Figure 17:
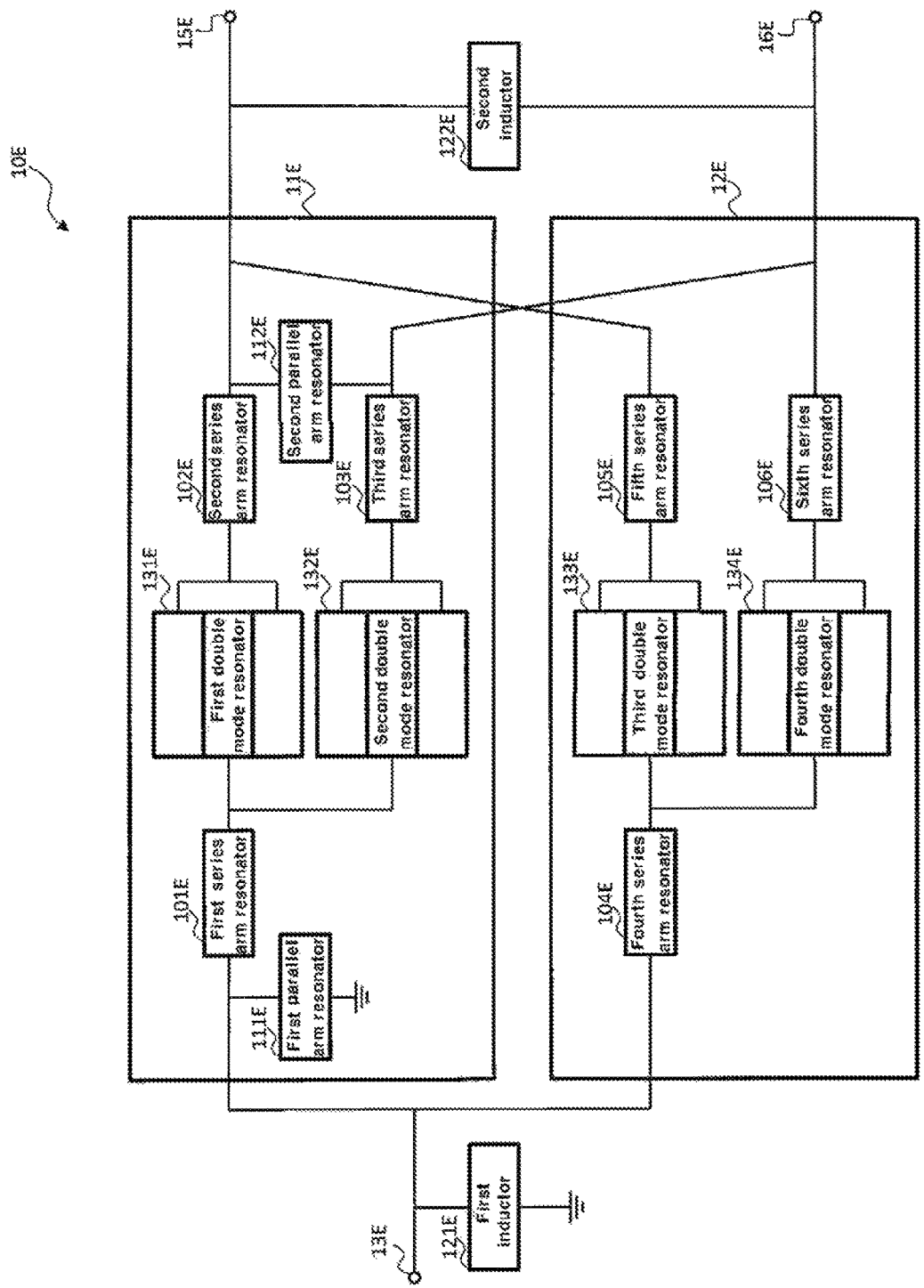
FIG. 17 is a block diagram showing the configuration of a surface acoustic wave device of a fifth embodiment of the present invention.

FIG. 17 is a block diagram showing the configuration of a surface acoustic wave device 10E of a fifth embodiment of the present invention.

The surface acoustic wave device 10E is provided with a first surface acoustic wave element 11E, a second surface acoustic wave element 12E, an input terminal 13E, a first output terminal 15E on the side of the first surface acoustic wave element 11E and a second output terminal 16E on the side of the second surface acoustic wave element 12E.

The first surface acoustic wave element 11E is provided with a first series arm resonator 101E, a second series arm resonator 102E, a third series arm resonator 103E, a first parallel arm resonator 111E, a second parallel arm resonator 112E, a first double mode resonator 131E and a second double mode resonator 132E.

The first series arm resonator 101E, the second series arm resonator 102E and the third series arm resonator 103E are, for example, general SAW resonators.

The third series arm resonator 103E is connected between the second double mode resonator 132E and the second output terminal 16E.

The first parallel arm resonator 111E and the second parallel arm resonator 112E are configured of, for example, general SAW resonators, and the first parallel arm resonator 111E is connected between a connection point of the input terminal 13E and the first series arm resonator 101E and the ground. On the other hand, the second parallel arm resonator 112E is connected between the second series arm resonator 102E and the third series arm resonator 103E.

In the first surface acoustic wave element 11E, the first parallel arm resonator 111E is connected at a position closest to the input terminal 13E. In addition, the first parallel arm resonator 111E is preferably set to have a resonance frequency lower than the pass band of the first surface acoustic wave element 11E.

The first double mode resonator 131E and the second double mode resonator 132E are, for example, general SAW resonators arranging three IDTs between reflectors.

The first double mode resonator 131E is connected between the first series arm resonator 101E and the second series arm resonator 102E. The second double mode resonator 132E is connected between the first series arm resonator 101E and the third series arm resonator 103E.

That is, since the first surface acoustic wave element 11E is provided with a SAW resonator having at least two IDTs, it is a BPF of a DMS type.

The second surface acoustic wave element 12E is provided with a fourth series arm resonator 104E, a fifth series arm resonator 105E, a sixth series arm resonator 106E, a third double mode resonator 133E and a fourth double mode resonator 134E.

The fourth series arm resonator 104E, the fifth series arm resonator 105E and the sixth series arm resonator 106E are, for example, general SAW resonators.

The fifth series arm resonator 105E is connected to the first output terminal 15E.

The third double mode resonator 133E and the fourth double mode resonator 134E are, for example, general SAW resonators arranging three IDTs between reflectors.

The third double mode resonator 133E is connected between the fourth series arm resonator 104E and the fifth series arm resonator 105E. The fourth double mode resonator 134E is connected between the fourth series arm resonator 104E and the sixth series arm resonator 106E.

That is, the first surface acoustic wave element 11E is a BPF of a DMS type provided with a SAW resonator having at least two IDTs.

A first inductor 121E is connected between the input terminal 13E and the ground. A second inductor 122E is connected between the first output terminal 15E and the second output terminal 16E.

Figure 18A:
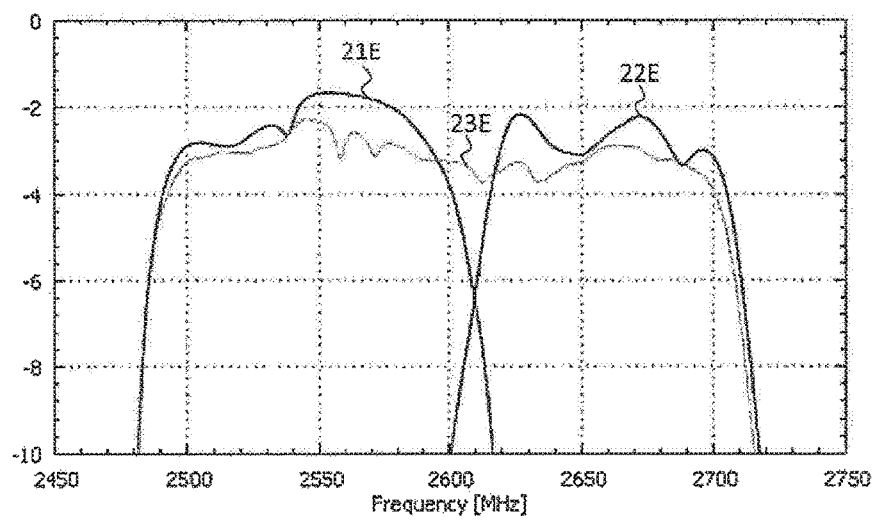
FIGS. 18A and 18B are graphs showing the frequency characteristic of the surface acoustic wave device shown in FIG. 17.
Figure 18B:
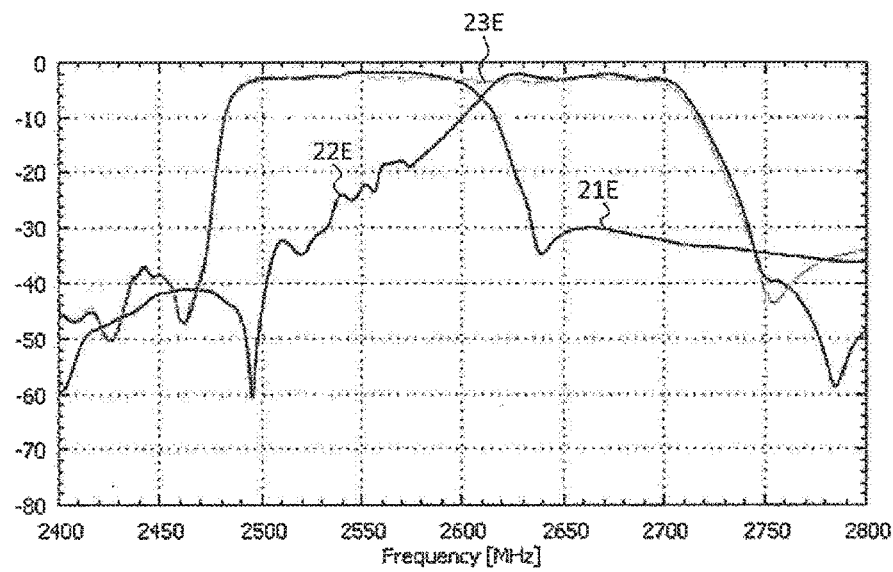

FIGS. 18A and 18B are graphs showing the frequency characteristics of the surface acoustic wave device 10E, the first surface acoustic wave element 11E and the second surface acoustic wave element 12E.

FIG. 18A is a graph showing the frequency MHz on the horizontal axis and the insertion loss dB on the vertical axis, in which a first frequency characteristic 21E, a second frequency characteristic 22E and a third frequency characteristic 23E respectively show the frequency characteristics of the first surface acoustic wave element 11E, the second surface acoustic wave element 12E and the surface acoustic wave device 10E. Specifically, FIG. 18A shows frequency characteristics in a range of frequency between 2,450 and 2,750 MHz and insertion loss between −10 and 0 dB.

The pass bands of the first frequency characteristic 21E and the second frequency characteristic 22E are practically 100 MHz and, in addition, have an attenuation characteristic of steeply decreasing at the low frequency and high frequency sides. In addition, on the high frequency side of the first frequency characteristic 21E and the low frequency side of the second frequency characteristic 22E, the first frequency characteristic 21E and the second frequency characteristic 22E intersect with each other at a point where the value of the insertion loss is about −6.6 dB.

The pass band of the third frequency characteristic 23E is practically an aggregation of the pass band of the first frequency characteristic 21E and the pass band of the second frequency characteristic 22E and, in addition, has an attenuation characteristic of steeply decreasing at the low frequency and high frequency sides. That is, the center frequency of the third frequency characteristic 23E is higher than the center frequency of the first frequency characteristic 21E and lower than the center frequency of the second frequency characteristic 22E.

Compared with FIG. 18A, FIG. 188 shows the frequency characteristics of the surface acoustic wave device 10E, the first surface acoustic wave element 11E and the second surface acoustic wave element 12E seeing the frequency MHz and the insertion loss dB within a further specific range. Specifically, FIG. 18B shows frequency characteristics in a range of frequency between 2,300 and 2,900 MHz and insertion loss between −80 and 0 dB.

Referring to FIG. 18B, the third frequency characteristic 23E has a favorable attenuation characteristic even in the attenuation bands of the low frequency and high frequency sides.

That is, the surface acoustic wave device 10E may pass a signal having a wide pass bandwidth with respect to the center frequency of the pass band.

Figure 19B:
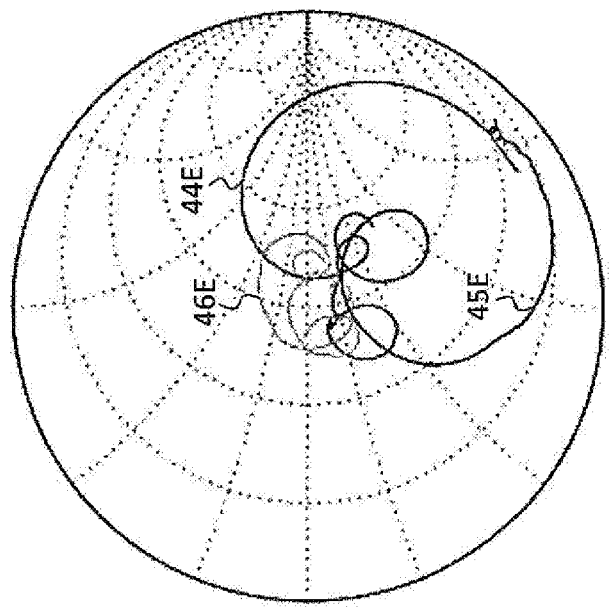
FIGS. 19A and 19B are Smith charts showing the impedance matching of the surface acoustic wave device shown in FIG. 17.
Figure 19A:
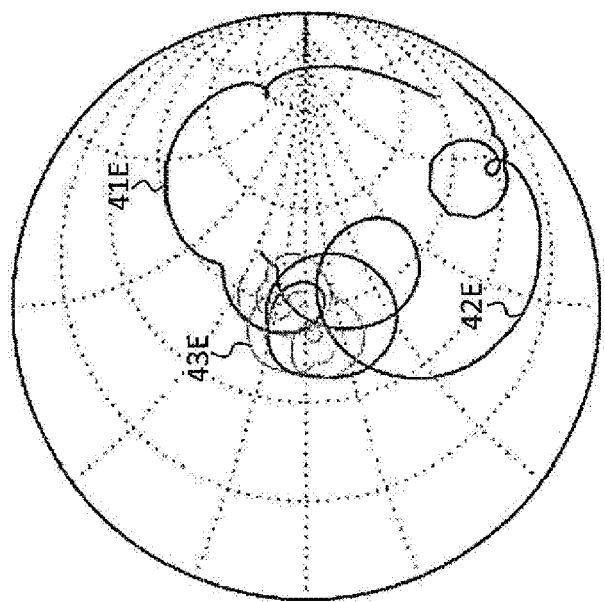

FIGS. 19A and 19B are Smith charts showing the impedance matching of the surface acoustic wave device 10E, the first surface acoustic wave element 11E and the second surface acoustic wave element 12E.

FIG. 19A shows input impedance at the input terminal 13E, and FIG. 19B shows output impedance at the first output terminal 15E and the second output terminal 16E. In addition, the center of the Smith charts shown in FIG. 19A and FIG. 19B is 50Ω.

In FIG. 19A, a first input impedance 41E, a second input impedance 42E and a third input impedance 43E respectively show input impedance of the first surface acoustic wave element 11E, the second surface acoustic wave element 12E and the surface acoustic wave device 10E. In FIG. 19B, a first output impedance 44E, a second output impedance 45E and a third output impedance 46E respectively show output impedance of the first surface acoustic wave element 11E, the second surface acoustic wave element 12E and the surface acoustic wave device 10E.

Referring to FIG. 19A, the first input impedance 41E and the second input impedance 42E are changed comparatively greatly according to change of a measurement frequency. However, the third input impedance 43E is comparatively stable since it practically shows 50Ω at each measurement frequency.

Referring to FIG. 19B, the first output impedance 44E and the second output impedance 45E are changed comparatively greatly according to change of a measurement frequency. However, the third output impedance 46E is comparatively stable since it practically shows 50Ω at each measurement frequency.

That is, the surface acoustic wave device 10E practically has favorable consistency of impedance at 50Ω at each measurement frequency.

In addition, consistency of impedance of the surface acoustic wave device 10E can be favorably set based on the reflection coefficients of the input terminal 13E, the first output terminal 15E and the second output terminal 16E of the first surface acoustic wave element 11E and the second surface acoustic wave element 12E.

Here, specific values of the reflection coefficients of the first surface acoustic wave element 11E and the second surface acoustic wave element 12E are shown in Table 5.

TABLE 5

| | | First surface acoustic wave (11E) | | Second surface acoustic wave (12E) | | Relation of reflection coefficients | |
|---|---|---|---|---|---|---|---|
| | | Reflection coefficient | Reflection coefficient | Reflection coefficient | Reflection coefficient | | |
| | | (Real part: $a_1$) | (Imaginary part: $b_1$) | (Real part: $a_2$) | (Imaginary part: $b_2$) | Real part | Imaginary part |
| Fifth embodiment | Input terminal | 0.24 | 0.43 | −0.181 | −0.593 | $a_1 \geq a_2$ | $b_1 > b_2$ |
| | Output terminal | 0.098 | −0.05 | −0.153 | −0.585 | $a_1 \geq a_2$ | $b_1 > b_2$ |

Referring to Table 5, at the input terminal 13E of the surface acoustic wave device 10E, the real part $a_1$ of the reflection coefficient of the first surface acoustic wave element 11E is 0.24, and the imaginary part $b_1$ is 0.43, and the real part $a_2$ of the reflection coefficient of the second surface acoustic wave element 12E is −0.181, and the imaginary part $b_2$ is −0.593. That is, at the input terminal 13E of the surface acoustic wave device 10E, a relation of $a_1 \geq a_2$ and $b_1 > b_2$ is established.

In the same manner, at the output terminal 14E of the surface acoustic wave device 10E, the real part $a_1$ of the reflection coefficient of the first surface acoustic wave element 11E is 0.098, and the imaginary part $b_1$ is −0.05, and the real part $a_2$ of the reflection coefficient of the second surface acoustic wave element 12E is −0.153, and the imaginary part $b_2$ is −0.585. That is, at the output terminal 14E of the surface acoustic wave device 10E, a relation of $a_1 \geq a_2$ and $b_1 > b_2$ is established.

As described above, in the surface acoustic wave device 10E, the first surface acoustic wave element 11E has a pass band at a low frequency band compared with the second surface acoustic wave element 12E, and in addition, the relation of $a_1 \geq a_2$ and $b_1 > b_2$ is satisfied between the reflection coefficients at the input terminal 13E, the first output terminal 15E and the second output terminal 16E.

Since it is designed to satisfy the conditions described above, the surface acoustic wave device 10E having a wide pass bandwidth signal (i.e., a fractional bandwidth of 5% or more) with respect to the center frequency of the pass band is obtained.

In addition, the first surface acoustic wave element 11E and the second surface acoustic wave element 12E are only examples and do not limit the present invention. The first surface acoustic wave element 11E and the second surface acoustic wave element 12E may be additionally provided with a plurality of SAW resonators, IDTs and the like or may be configured of SAW resonators, IDTs and the like fewer than the number of SAW resonators, IDTs and the like shown in the figure. Designers of the surface acoustic wave device 10E may freely change the number, characteristics, arrangement and the like of the SAW resonators, IDTs and the like provided in the first surface acoustic wave element 11E and the second surface acoustic wave element 12E.

Although elements using a surface acoustic wave are described above, elements using a bulk acoustic wave can be used. The bulk acoustic wave element can be implemented by a Film Bulk Acoustic Resonator (FBAR), a Solid Mounted Resonator (SMR) or the like.

According to the present invention, a signal having a wide pass bandwidth with respect to a center frequency of a pass band can be passed.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An acoustic wave device comprising:
a first acoustic wave element provided with a first pass band; and
a second acoustic wave element having a second pass band in a high frequency band compared with the first pass band of the first acoustic wave element,
wherein the first acoustic wave element and the second acoustic wave element have a common input terminal and a common output terminal,
wherein a frequency of a high frequency side of the first pass band of the first acoustic wave element is partially overlapped with a frequency of a low frequency side of the second pass band of the second acoustic wave element, and
wherein the frequency of a pass band at the high frequency side of the first pass band is partially overlapped with the frequency of a pass band at the low frequency side of the second pass band, by selecting real parts and imaginary parts of reflection coefficients of the first acoustic wave element and the second acoustic wave element.

2. The device according to claim 1, wherein if it is assumed that the real part and the imaginary part of the reflection coefficient of the first acoustic wave element are a1 and b1 and the real part and the imaginary part of the reflection coefficient of the second acoustic wave element are a2 and b2 respectively, a relation of a1≥a2 and b1>b2 is established.

3. The device according to claim 1, wherein at least one of the first acoustic wave element and the second acoustic wave element is an acoustic wave element of a ladder type.

4. An acoustic wave device comprising:
a first acoustic wave element provided with a first pass band; and
a second acoustic wave element having a second pass band in a high frequency band compared with the first pass band of the first acoustic wave element,
wherein the first acoustic wave element and the second acoustic wave element have a common input terminal and a common output terminal,
wherein a frequency of a high frequency side of the first pass band of the first acoustic wave element is partially overlapped with a frequency of a low frequency side of the second pass band of the second acoustic wave element,
wherein at least any one of the input terminal and the output terminal of the first acoustic wave element and the second acoustic wave element is provided with a parallel arm resonator, and
wherein a resonance frequency of the parallel arm resonator is lower than the first pass band.

* * * * *